(12) United States Patent
Hayashiguchi et al.

(10) Patent No.: US 11,336,275 B2
(45) Date of Patent: *May 17, 2022

(54) SWITCHING DEVICE AND ELECTRONIC CIRCUIT

(71) Applicant: ROHM CO., LTD., Kyoto (JP)

(72) Inventors: Masashi Hayashiguchi, Kyoto (JP); Kazuhide Ino, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/070,496

(22) Filed: Oct. 14, 2020

(65) Prior Publication Data

US 2021/0028779 A1     Jan. 28, 2021

Related U.S. Application Data

(66) Continuation of application No. 16/270,248, filed on Feb. 7, 2019, now Pat. No. 10,826,481, which is a
(Continued)

(30) Foreign Application Priority Data

Nov. 20, 2013    (JP)  ................................ 2013-240105

(51) Int. Cl.
    *H02H 9/00*       (2006.01)
    *H03K 17/081*     (2006.01)
    (Continued)

(52) U.S. Cl.
    CPC ... *H03K 17/08104* (2013.01); *G01R 19/0092* (2013.01); *H01L 23/3107* (2013.01);
(Continued)

(58) Field of Classification Search
None
See application file for complete search history.

(56) References Cited

U.S. PATENT DOCUMENTS 6,307,272 B1   10/2001   Takahashi et al.
6,351,399 B2   2/2002   Takanashi et al.
(Continued)

FOREIGN PATENT DOCUMENTS

CN         1258084      6/2000
CN       103296866      9/2013
(Continued)

OTHER PUBLICATIONS

Decision to Grant a Patent issued for Japanese Patent Application No. 2020-006028, Dispatch Date: Dec. 10, 2020, 5 pages including English machine translation.
(Continued)

*Primary Examiner* — Stephen W Jackson
(74) *Attorney, Agent, or Firm* — Hamre, Schumann, Mueller & Larson, P.C.

(57) ABSTRACT

A switching device 1 includes a SiC semiconductor chip 11 which has a gate pad 14, a source pad 13 and a drain pad 12 and in which on-off control is performed between the source and the drain by applying a drive voltage between the gate and the source in a state where a potential difference is applied between the source and the drain, a sense source terminal 4 electrically connected to the source pad 13 for applying the drive voltage, and an external resistance (source wire 16) that is interposed in a current path between the sense source terminal 4 and the source pad 13, is separated from sense source terminal 4, and has a predetermined size.

12 Claims, 10 Drawing Sheets

Related U.S. Application Data continuation of application No. 15/037,592, Substitute for application No. PCT/JP2014/080497, filed on Nov. 18, 2014, now Pat. No. 10,263,612.

(51) Int. Cl.

| | | |
|---|---|---|
| *H03K 17/082* | (2006.01) | |
| *H03K 17/12* | (2006.01) | |
| *H01L 23/00* | (2006.01) | |
| *H01L 25/07* | (2006.01) | |
| *H01L 25/18* | (2006.01) | |
| *H02H 3/20* | (2006.01) | |
| *H02H 9/04* | (2006.01) | |
| *H02M 7/5387* | (2007.01) | |
| *H01L 23/31* | (2006.01) | |
| *H01L 23/373* | (2006.01) | |
| *G01R 19/00* | (2006.01) | |
| *H02M 1/00* | (2006.01) | |

(52) U.S. Cl.
CPC .......... *H01L 23/3735* (2013.01); *H01L 24/40* (2013.01); *H01L 24/49* (2013.01); *H01L 24/73* (2013.01); *H01L 25/072* (2013.01); *H01L 25/18* (2013.01); *H02H 3/202* (2013.01); *H02H 9/046* (2013.01); *H02M 7/5387* (2013.01); *H03K 17/0822* (2013.01); *H03K 17/122* (2013.01); *H01L 24/33* (2013.01); *H01L 24/37* (2013.01); *H01L 24/48* (2013.01); *H01L 2224/0603* (2013.01); *H01L 2224/291* (2013.01); *H01L 2224/32225* (2013.01); *H01L 2224/32245* (2013.01); *H01L 2224/33181* (2013.01); *H01L 2224/371* (2013.01); *H01L 2224/40095* (2013.01); *H01L 2224/40225* (2013.01); *H01L 2224/48091* (2013.01); *H01L 2224/48106* (2013.01); *H01L 2224/48227* (2013.01); *H01L 2224/48247* (2013.01); *H01L 2224/4903* (2013.01); *H01L 2224/49111* (2013.01); *H01L 2224/49175* (2013.01); *H01L 2224/73221* (2013.01); *H01L 2224/73263* (2013.01); *H01L 2224/73265* (2013.01); *H01L 2224/83801* (2013.01); *H01L 2224/84801* (2013.01); *H01L 2924/00014* (2013.01); *H01L 2924/10272* (2013.01); *H01L 2924/12032* (2013.01); *H01L 2924/1305* (2013.01); *H01L 2924/13055* (2013.01); *H01L 2924/13091* (2013.01); *H01L 2924/181* (2013.01); *H01L 2924/19107* (2013.01); *H02M 1/0009* (2021.05); *H03K 2217/0027* (2013.01); *Y02B 70/10* (2013.01)

(56) References Cited

U.S. PATENT DOCUMENTS

| | | | |
|---|---|---|---|
| 8,723,178 | B2 | 5/2014 | Li |
| 9,607,940 | B2* | 3/2017 | Yato .................. H01L 23/49562 |
| 10,312,167 | B2 | 6/2019 | Bayerer |
| 10,826,481 | B2* | 11/2020 | Hayashiguchi ..... H01L 23/3735 |
| 2001/0019856 | A1 | 9/2001 | Takahashi et al. |
| 2012/0025794 | A1 | 2/2012 | Inoue et al. |
| 2013/0221532 | A1 | 8/2013 | Fujita et al. |
| 2016/0261180 | A1 | 9/2016 | Brueckner et al. |
| 2019/0295991 | A1* | 9/2019 | Takahashi ............... H01L 23/24 |

FOREIGN PATENT DOCUMENTS

| | | |
|---|---|---|
| JP | H10261756 | 9/1998 |
| JP | 2000-49184 | 2/2000 |
| JP | 2005033965 | 2/2005 |
| JP | 2005-113695 | 4/2005 |
| JP | 2005-137072 | 5/2005 |
| JP | 2006109665 | 4/2006 |
| JP | 2009176804 | 8/2009 |
| JP | 2011254387 | 12/2011 |
| JP | 2012050065 | 3/2012 |
| JP | 2013179744 | 9/2013 |
| WO | 2013018760 | 2/2013 |

OTHER PUBLICATIONS

International Search Report issued in PCT/JP2014/080497, dated Mar. 3, 2015 (1 page).
International Preliminary Report on Patentability for PCT/JP2014/080497, dated Jun. 2, 2016, 10 pages including English translation.
Extended European Search Report issued for corresponding European Patent Application No. 14863596.4, dated Aug. 14, 2017, 9 pages.
Office Action issued for Chinese Patent Application No. 201480063746.5, dated Feb. 27, 2019, 15 pages including English translation.
Office Action issued for Japanese Patent Application No. 2019-020031, dated Oct. 10, 2019, 8 pages including English machine translation.
Office Action issued for Japanese Patent Application No. 2021-002409, dated Apr. 15, 2021, 4 pages including English machine translation.

* cited by examiner

SWITCHING DEVICE AND ELECTRONIC CIRCUIT

FIELD OF THE INVENTION

The present invention relates to a switching device using SiC and an electronic circuit comprising the same (for example, inverter circuit, converter circuit and the like).

BACKGROUND ART

A switching device used for an electronic circuit such as an inverter circuit, a converter circuit and the like is generally configured from a plurality of switching elements connected in parallel to increase an electric capacity. An SiC switching element is known as a switching element along with an Si switching element. An SiC switching element includes, for example, SiC-MOSFET (Metal-Oxide-Semiconductor Field Effect Transistor), SiC-bipolar transistor (Bipolar Transistor), SiC-JFET (Junction Field Effect Transistor), SiC-IGBT (Insulated Gate Bipolar Transistor), and the like.

PRIOR ART DOCUMENT

Patent Document

Patent Document 1: Japanese Unexamined Patent Publication No. 2005-137072

OUTLINE OF THE INVENTION

Subject to be Solved by the Invention

In an electronic circuit to which an SiC switching device (MOSFET) is incorporated, when, for example, a power-supply voltage is directly supplied to the device thereby to cause a short circuit, an overcurrent (short-circuit current) may flow through the device. In this case, while this short-circuit current is blocked by connecting a gate terminal of the device to ground, a certain time is required before blocking. For example, it takes around 10 μsec (microsecond) after the overcurrent is detected.

However, if an overcurrent cannot be blocked within a short-circuit capacity of each device, thermal destruction of the device may be caused due to thermal runaway by the short-circuit current.

An object of the present invention is to provide a switching device having a low impact on a switching performance of a switching element and being capable of improving a short-circuit capacity of the device as well as an electronic circuit comprising the same.

SUMMARY OF THE INVENTION

A switching device according to the invention includes a SiC switching element which has a first electrode, a second electrode and a third electrode and in which on-off control is performed between the second electrode and the third electrode by applying a drive voltage between the first electrode and the second electrode in a state where a potential difference is applied between the second electrode and the third electrode, a drive terminal electrically connected to the second electrode for applying the drive voltage, and an external resistance that is interposed in a current path between the drive terminal and the second electrode, is separated from at least one of the drive terminal and the second electrode, and has a predetermined resistance value.

According to this configuration, the external resistance is interposed in series in the current path between the drive terminal and the second electrode. Thus, a voltage applied between the first electrode and the second electrode when an overcurrent flows between the second electrode and the third electrode can be reduced by a voltage drop at this external resistance in comparison to a case where the first electrode and the second electrode are directly connected by a bonding wire or the like to form this current path. As a result, a short-circuit capacity of the device can be increased.

On the other hand, by properly setting a resistance value of this external resistance, the voltage drop at this external resistance can be reduced when a current flowing between the second electrode and the third electrode is relatively small or is a rated value. In this case, a reduction of the voltage applied between the first electrode and the second electrode can be suppressed, and a drive voltage necessary and sufficient for a switching operation can be fed to a switching element. That is, an impact on a switching performance of the switching element can be small.

One embodiment of the present invention includes an output terminal for outputting a current flowing by the on control and a conductive member connecting the output terminal and the second electrode, and the external resistance includes the conductive member.

According to this configuration, since the conductive member for current output is used as the external resistance, the effect of the above-described improvement of the short-circuit capacity can be achieved with a low cost without the number of components increased.

One embodiment of the present invention includes the conductive member includes a bonding wire stretched between the output terminal and the second electrode.

According to this configuration, a resistance value of the bonding wire is a value previously fixed by its constituent material, length, wire diameter and the like. Thus, the resistance value of the external resistance can be easily adjusted by appropriately increasing and decreasing the number of wires between the output terminal and the second electrode.

One embodiment of the present invention includes a resin package sealing the SiC switching element, the drive terminal and the external resistance.

According to this configuration, since the external resistance is sealed by the resin package, the switching device can be installed with a conventional layout.

In one embodiment of the present invention, the first electrode is a gate electrode, the second electrode is a source electrode, the third electrode is a drain electrode, and the drive terminal is a sense source terminal. That is, the switching device of the present invention may be a MOSFET.

In one embodiment of the present invention, the first electrode is a gate electrode, the second electrode is an emitter electrode, the third electrode is a collector electrode, and the drive terminal is a sense emitter terminal. That is, the switching device of the present invention may be an IGBT.

In one embodiment of the present invention, the first electrode is a base electrode, the second electrode is an emitter electrode, the third electrode is a collector electrode, and the drive terminal is a sense emitter terminal. That is, the switching device of the present invention may be a bipolar transistor.

An electronic circuit of the present invention includes the switching device of the present invention, an overcurrent detection circuit for detecting that an overcurrent is flowing through the switching device, and an overcurrent protection circuit for blocking the current flowing through the switching device when an overcurrent is detected by the overcurrent detection circuit.

According to this configuration, an electronic circuit can be provided which has a small impact on a switching performance of the switching element and can improve the short-circuit capacity of the switching device since it comprises the switching device of the present invention.

The above-described and other objects, features and effects of the present invention are revealed by the following embodiments described in reference to accompanied drawings.

DESCRIPTION OF EMBODIMENTS

Figure 1:
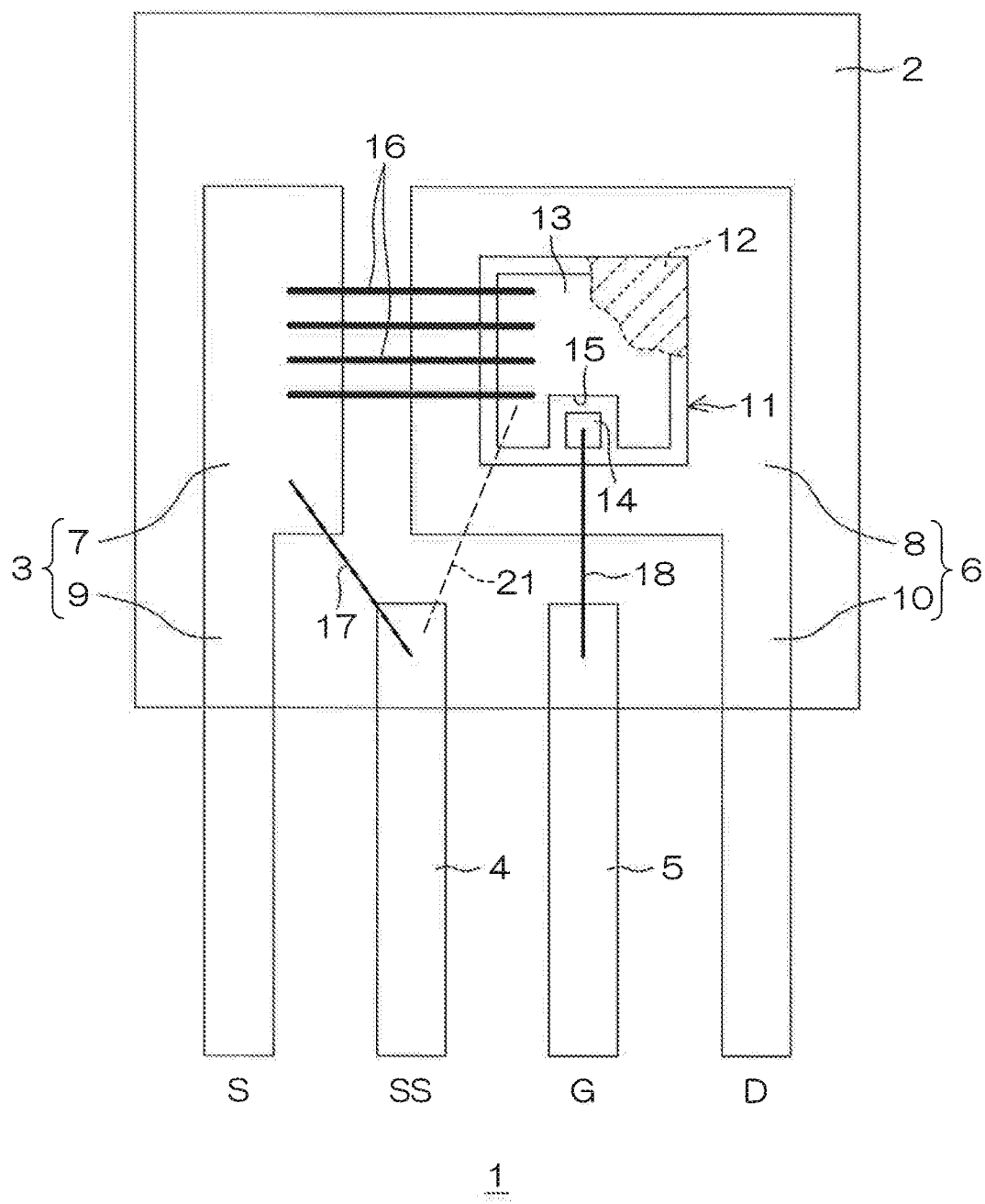
FIG. 1 is a schematic view of a switching device according to one embodiment of the present invention.

Embodiments of the present invention is described below in detail referring to the drawings.

Figure 2:
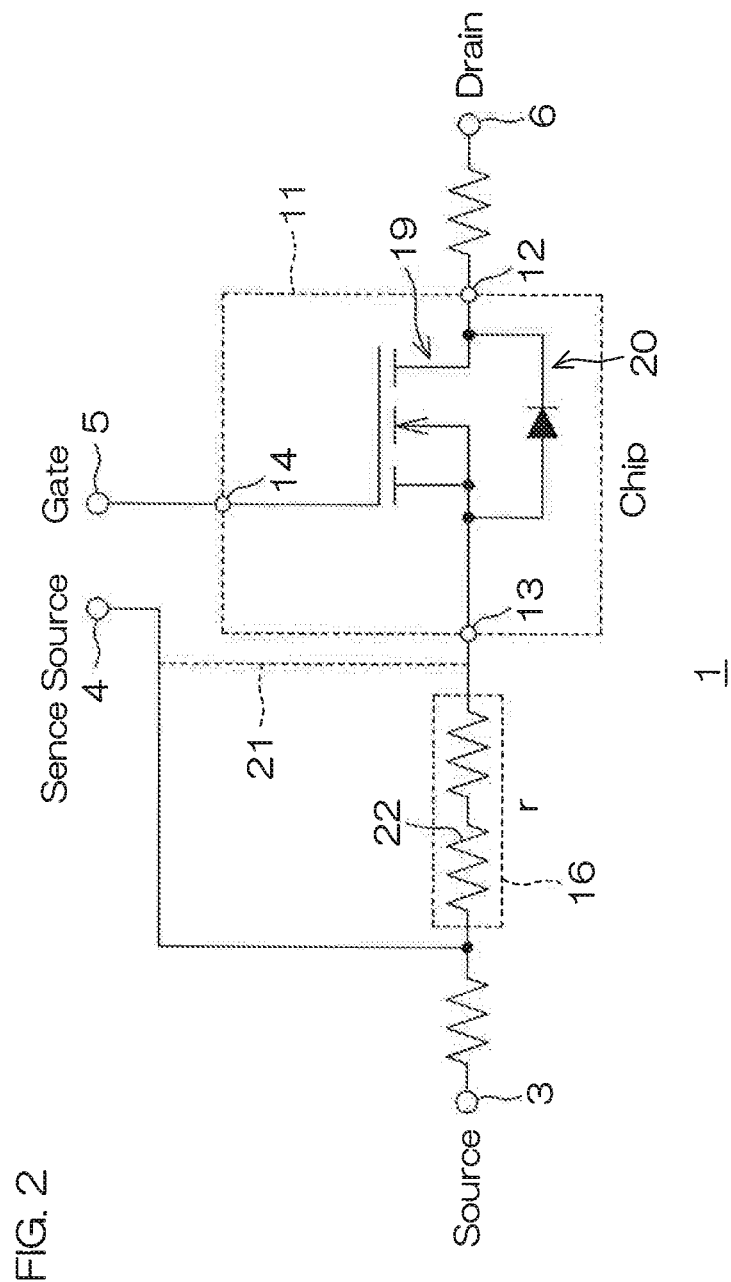
FIG. 2 is an electrical circuit diagram of the switching device in FIG. 1.

FIG. 1 is a schematic view of a switching device 1 according to one embodiment of the present invention. FIG. 2 is an electrical circuit diagram of the switching device 1 in FIG. 1. In FIG. 1, to clarify the configuration of the switching device 1, one corner portion (broken-line hatched area) of a semiconductor chip 11 is shown transparently.

The switching device 1 includes a resin package 2 having a flat rectangular-parallelepiped shape, a source terminal 3 (S) that is sealed on the resin package 2 and serves as an example of an output terminal of the present invention, a sense source terminal 4 (SS) as an example of a drive terminal of the present invention, a gate terminal 5 (G) and a drain terminal 6 (D).

The four terminals 3 to 6 are respectively formed of a metal plate in a predetermined shape, and are arranged in order from one side surface of the resin package 2 to a side surface opposed to it.

In this embodiment, each of the source terminal 3 and the drain terminal 6 is formed in a shape including islands 7, 8 in a rectangle shape and terminal portions 9, 10 in an elongated rectangle shape extending linearly from one side of these islands 7, 8. The sense source terminal 4 and the gate terminal 5 are formed in an elongated rectangle shape similar to the terminal portions 9, 10. The terminal portion 9 of the source terminal 3, the sense source terminal 4, the gate terminal 5, and the terminal portion 10 of the drain terminal 6 are arranged so as to be parallel one another.

The semiconductor chip 11 as an example of an SiC switching element of the present invention is placed on the drain terminal 6 (center portion of the island 8). An almost entire rear surface of the semiconductor chip 11 is provided with a drain pad 12 as an example of a third electrode of the present invention, and this drain pad 12 is joined to the island 8. Thus, the drain pad 12 of the semiconductor chip 11 and the drain terminal 6 are electrically connected. A front surface of the semiconductor chip 11 is provided with a source pad 13 as an example of a second electrode of the present invention and a gate pad 14 as an example of a first electrode of the present invention.

The source pad 13 has a generally square shape in a plan view, and is formed in a manner to cover almost an entire region of the front surface of the semiconductor chip 11. The source pad 13 is provided with a removal region 15 in a vicinity of a center of its one side. The removal region 15 is not provided with the source pad 13. The gate pad 14 is disposed on the removal region 15. The gate pad 14 and the source pad 13 are spaced apart and are insulated from each other.

A plurality of source wires 16 (bonding wires) are stretched as an example of a conductive member of the present invention between the source pad 13 and the source terminal 3, and the source pad 13 and the source terminal 3 are electrically connected by the source wires 16. In this embodiment, four source wires 16 having the same length are arranged parallel to each other. Thus, a resistance of each source wire 16 can be unified to a constant value. Further, a sense source wire 17 (bonding wire) is stretched between the source terminal 3 (island 7) and the sense source terminal 4. Thus, the sense source terminal 4 is electrically connected to the source pad 13 via a current path including the sense source wire 17 and the source wires 16.

Thus, instead of directly connecting the sense source terminal 4 and the source pad 13 by a conventional wire 21 shown in FIG. 1 with a broken line, one end of the sense source wire 17 is separated from the source pad 13 and is connected to the source terminal 3. As a result, as shown in FIG. 2, an external resistance 22 having a resistance value r depending on a constituent material, a length, a wire diameter and the like of the source wire 16 can be connected in series between the sense source terminal 4 and the source pad 13. That is, in the switching device 1 according to this embodiment, a position of the sense source is spaced from a source end (source pad 13) of the semiconductor chip 11, and a wire, wiring and the like intervene therebetween, whereby an external gate resistance (external resistance 22) which serves as a parasitic resistance when the gate-to-source voltage is applied to the semiconductor chip 11 is provided.

A gate wire 18 (bonding wire) is stretched between the gate pad 14 and the gate terminal 5, and the gate pad 14 and the gate terminal 5 are electrically connected by the gate wire 18.

Further, in this embodiment, as shown in FIG. 2, the semiconductor chip 11 includes a MOSFET 19 using SiC (SiC-MOSFET) and a body diode 20. A source, a drain and a gate of the MOSFET 19 are electrically connected to the source pad 13, the drain pad 12 and the semiconductor chip 11, respectively. The switching element formed in the semiconductor chip 11 may be an element other than a MOSFET.

For example, this switching element may be SiC-IGBT, a SiC-bipolar transistor, SiC-JFET and the like. When the switching element is SiC-IGBT, the source pad 13, the drain pad 12, the gate pad 14 and the sense source terminal 4 respectively correspond to an emitter pad, a collector pad, a gate pad and a sense emitter terminal of a SiC-IGBT. When the switching element is a bipolar transistor, the source pad 13, the drain pad 12, the gate pad 14 and the sense source terminal 4 respectively correspond to an emitter pad, a collector pad, a base pad and a sense emitter terminal of a SiC-bipolar transistor.

Further, the resin package 2 seals the semiconductor chip 11, the respective entire wires 16 to 18, the entirety of the island 7 and part of the terminal portion 9 of the source terminal 3, part of each of the sense source terminal 4 and the gate terminal 5, as well as the entire island 8 and part of the terminal portion 10 of the drain terminal 6. Parts of the terminal portion 9 of the source terminal 3, the sense source terminal 4, the gate terminal 5 and the terminal portion 10 of the drain terminal 6 are exposed respectively.

Figure 3:
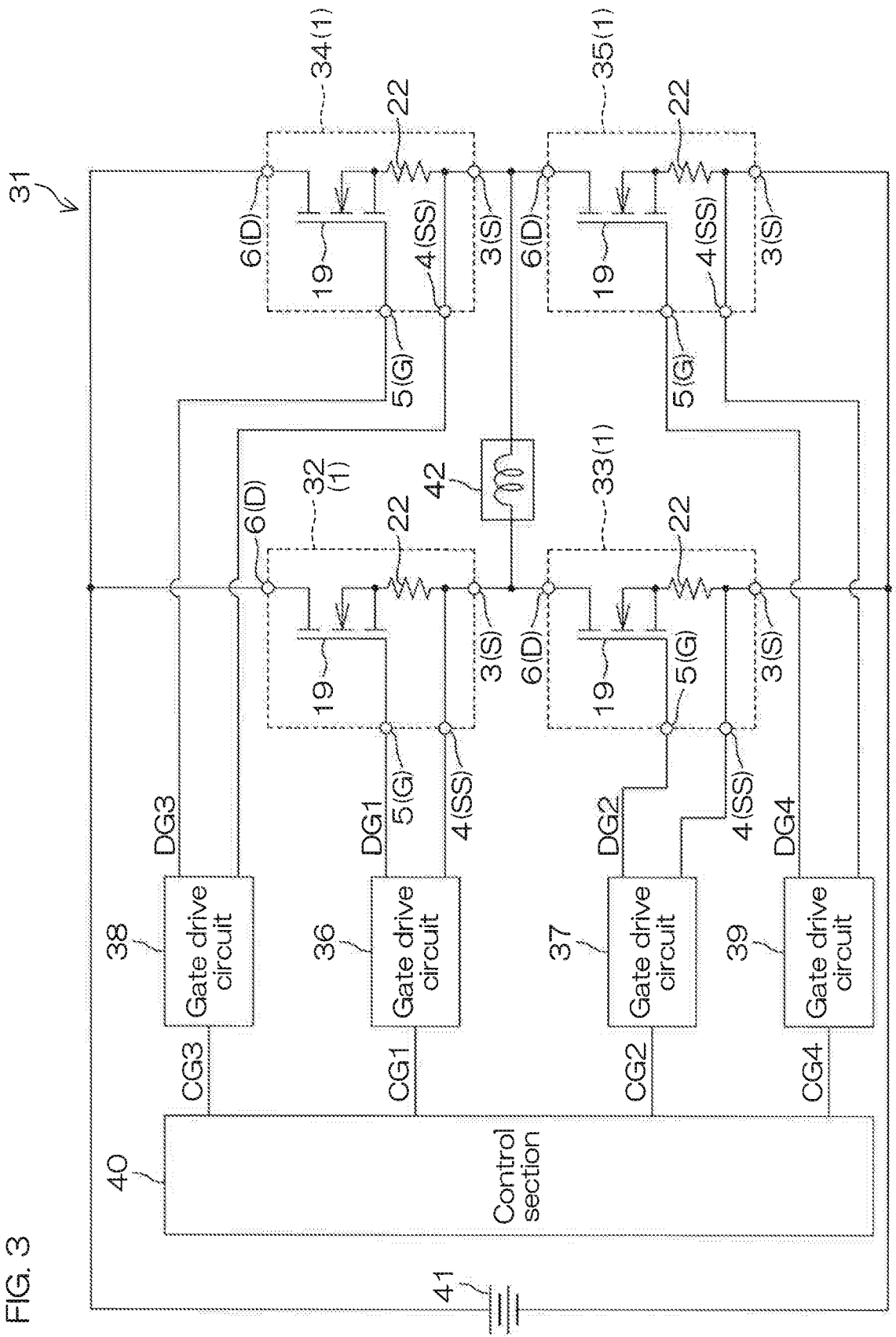
FIG. 3 is an electrical circuit diagram of an inverter circuit according to one embodiment of the present invention.
Figure 4:
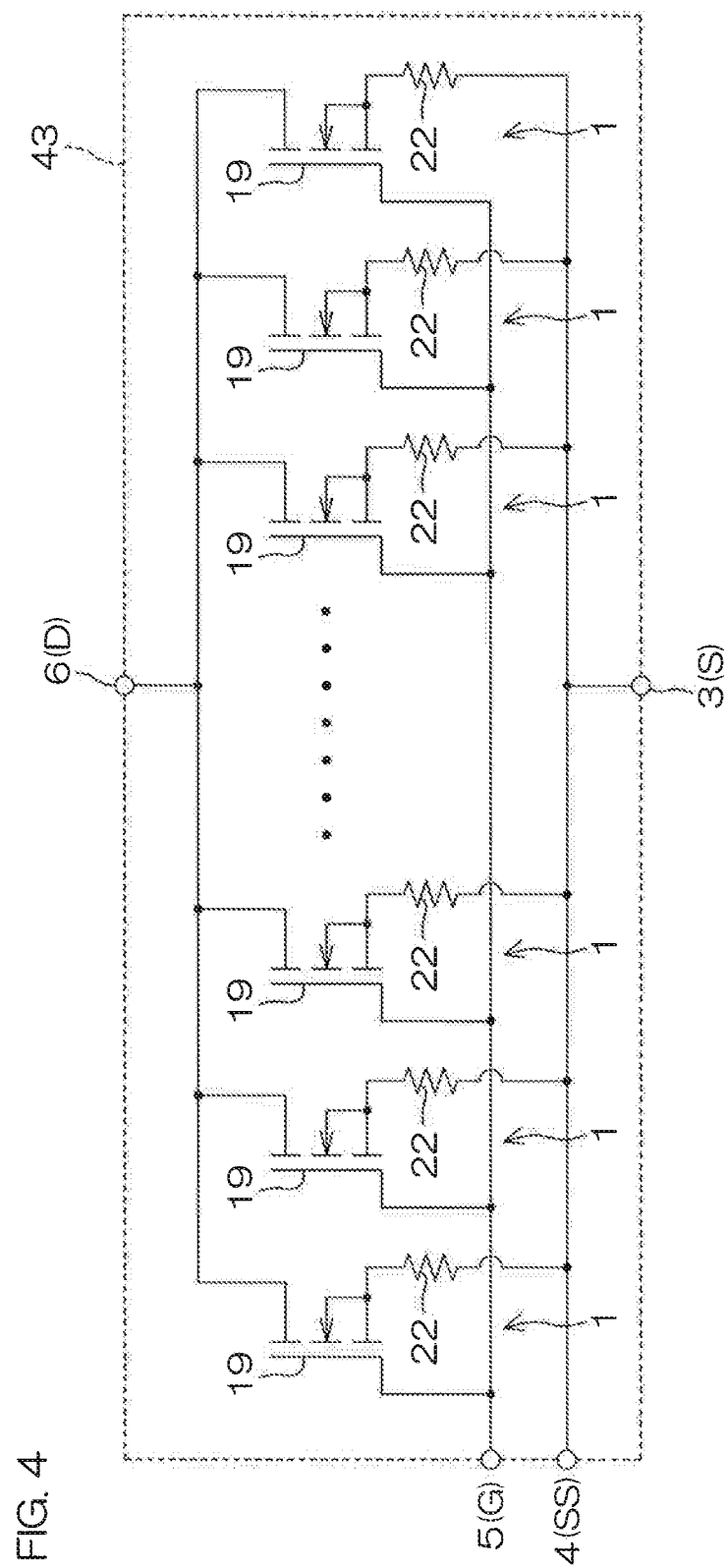
FIG. 4 is an electrical circuit diagram showing an electrical configuration of a module to which a plurality of the switching devices in FIG. 1 are installed.

FIG. 3 is an electrical circuit diagram of an inverter circuit 31 according to an embodiment of the present invention. FIG. 4 is an electrical circuit diagram showing an electrical configuration of a switching module 43 to which a plurality of the switching devices 1 in FIG. 1 are installed.

The inverter circuit 31 as an example of an electrical circuit of the present invention includes first to fourth switching devices 32 to 35, first to fourth gate drive circuits 36 to 39, and a control section 40.

The first to fourth switching devices 32 to 35 are respectively configured from the above-described switching devices 1. FIG. 3 selectively shows from the circuit elements in FIG. 2 what are necessary for illustration of FIG. 3. Further, as the first switching device 32 is shown as a representative example in FIG. 4, for example, the first to fourth switching devices 32 to 35 may be incorporated into the inverter circuit as the switching module 43 configured by parallelly connecting a plurality of the switching devices 1.

A drain terminal 6 of the first switching device 32 is connected to a positive electrode terminal of a power supply 41. A source terminal 3 of the first switching device 32 is connected to a drain terminal 6 of the second switching device 33. A gate terminal 5 of the first switching device 32 and a sense source terminal 4 of the first switching device 32 are connected to the first gate drive circuit 36.

A source terminal 3 of the second switching device 33 is connected to a negative electrode terminal of the power supply 41. A gate terminal 5 of the second switching device 33 and a sense source terminal 4 of the second switching device 33 are connected to the second gate drive circuit 37.

A drain terminal 6 of the third switching device 34 is connected to the positive electrode terminal of the power supply 41. A source terminal 3 of the third switching device 34 is connected to a drain terminal 6 of the fourth switching device 35. A gate terminal 5 of the third switching device 34 and a sense source terminal 4 of the third switching device 34 are connected to the third gate drive circuit 38.

A source terminal 3 of the fourth switching device 35 is connected to the negative electrode terminal of the power supply 41. A gate terminal 5 of the fourth switching device 35 and a sense source terminal 4 of the fourth switching device 35 are connected to a fourth gate drive circuit 39. A load 42 is connected between a connecting point between the first switching device 32 and the second switching device 33 and a connecting point between the third switching device 34 and the fourth switching device 35.

The control section 40 comprises a microcomputer including a CPU and a memory (ROM, RAM and the like) storing a program thereof. The control section 40 generates a first gate control signal CG1 to a MOSFET 19 of the first switching device 32, a second gate control signal CG2 to a MOSFET 19 of the second switching device 33, a third gate control signal CG3 to a MOSFET 19 of the third switching device 34, and a fourth gate control signal CG4 to a MOSFET 19 of the fourth switching device 35, and provides them to the respective first to fourth gate drive circuits 36 to 39.

Based on the respective gate control signals CG1, CG2, CG3, CG4 fed from the control section 40, the respective gate drive circuits 36, 37, 38, 39 generate gate drive signals DG1, DG2, DG3, DG4 to the first switching device 32, the second switching device 33, the third switching device 34 and the fourth switching device 35 and output them. Thus, the first to fourth switching devices 32 to 35 are drive-controlled.

In such an inverter circuit 31, the first switching device 32 and the fourth switching device 35 are turned on, for example. Thereafter, by turning off these switching devices 32 and 35, all of the switching devices 32 to 35 are set to a turned-off state. After a predetermined dead time period has passed, the second switching device 33 and the third switching device 34 are turned on. Thereafter, by turning off these switching devices 33 and 34, all of the switching devices 32 to 35 are set to a turned-off state. After a predetermined dead time period has passed, the first switching device 32 and the fourth switching device 35 are again turned on. Repetition of such actions drives the load 42 in AC.

The respective gate drive circuits 36, 37, 38, 39 have an overcurrent protection function for protecting the corresponding switching devices 32, 33, 34, 35 when a short circuit or the like where a voltage of the power supply 41 is directly applied to these switching devices 32, 33, 34, 35 occurs. The case when a short circuit where the voltage of the power supply 41 is directly applied to the switching devices 32, 33, 34, 35 occurs includes, for example, a case where the load 42 is short-circuited, a case where two switching devices (32, 33; 34, 35) connected in series between the positive electrode terminal and the negative electrode terminal of the power supply 41 are turned on at the same time, and a case where one of the two switching devices (32, 33; 34, 35) connected in series between the positive electrode terminal and the negative electrode terminal of the power supply 41 is short-circuited and damaged. Since configurations of the respective gate drive circuits 36, 37, 38, 39 are the same, the overcurrent protection function of the first gate drive circuit 36 is described in detail below.

Figure 5:
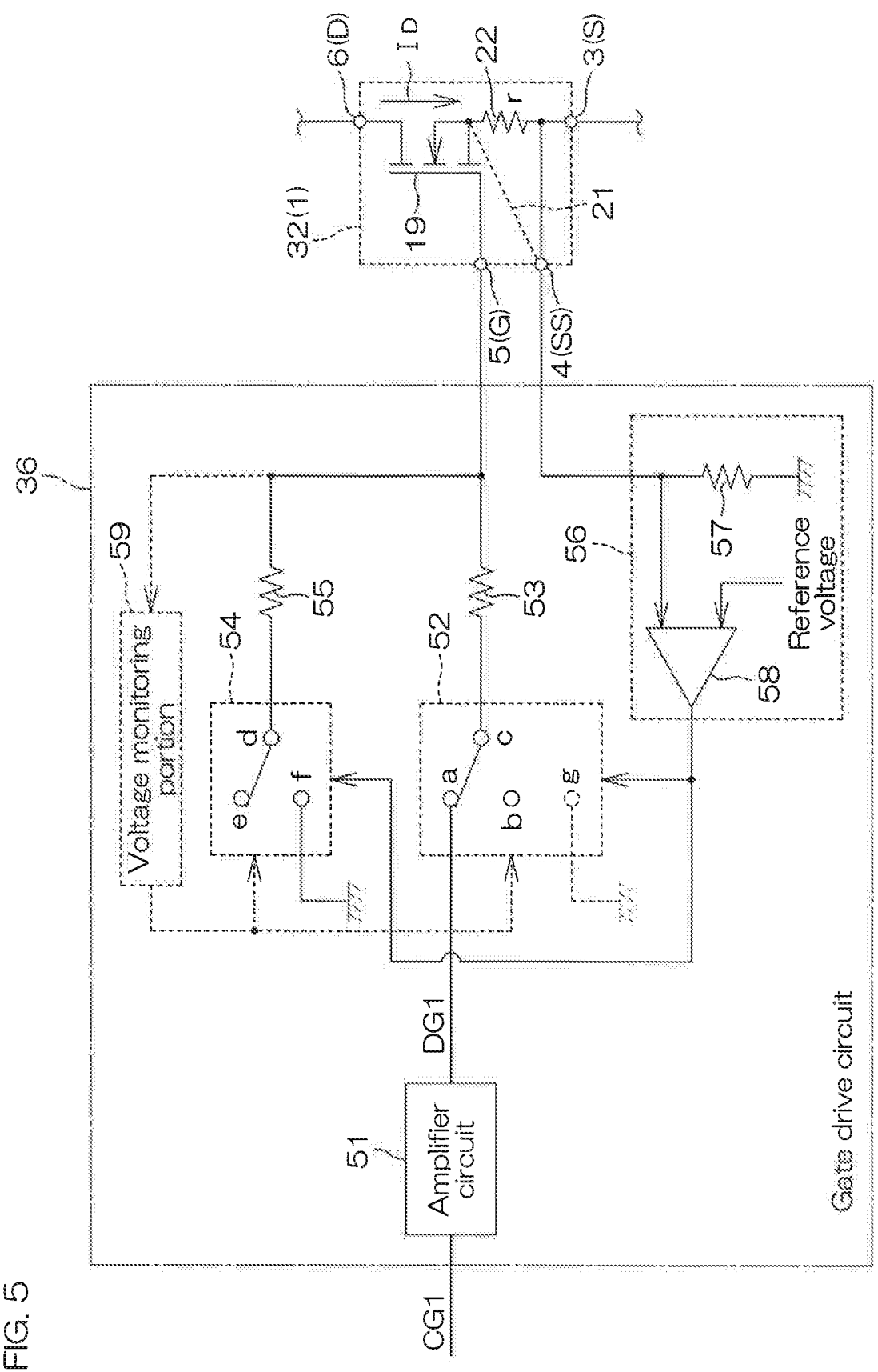
FIG. 5 is an electrical circuit diagram showing an electrical configuration of a gate drive circuit.

FIG. 5 is an electrical circuit diagram showing an electrical configuration of the gate drive circuit 36.

The first gate drive circuit 36 includes an amplifier circuit 51, a first switching circuit 52, a gate resistance 53, a second switching circuit 54, a current blocking resistance 55 and an overcurrent detection circuit 56.

The gate control signal CG1 from the control section 40 is input into an input terminal of the amplifier circuit 51. The amplifier circuit 51 generates the gate drive signal DG1 by amplifying the gate control signal CG1. An output terminal of the amplifier circuit 51 is connected to one input terminal a of the first switching circuit 52. The first switching circuit 52 has two input terminals a, b and one output terminal c, and selects one of the input terminals a, b and connects it to the output terminal c. The other input terminal b of the first switching circuit 52 is in an open state. The output terminal c of the first switching circuit 52 is connected to the gate terminal 5 of the first switching device 32 via the gate resistance 53. The first switching circuit 52 is controlled by an output of the overcurrent detection circuit 56.

The second switching circuit 54 has one input terminal d and two output terminals e, f, and selects one of the output terminals e, f and connects to it the input terminal d. The input terminal d is connected to a connecting point between the gate resistance 53 and the gate terminal 5 of the first switching device 32 via the current blocking resistance 55. The one output terminal e is in an open state. The other output terminal f is grounded. The second switching circuit 54 is controlled by an output of the overcurrent detection circuit 56. A resistance value of the gate resistance 53 is referred to as r1, and a resistance value of the current blocking resistance 55 is referred to as r2. As described below, r2 is set to a value larger than that of r1.

The overcurrent detection circuit 56 includes a current detecting resistance 57 and a comparison circuit 58. One end of the current detecting resistance 57 is connected to the sense source terminal 4 of the first switching device 32, and the other end of the current detecting resistance 57 is grounded. A voltage across the terminals (voltage drop amount) of the current detecting resistance 57 takes a value according to an amount of a current $I_D$ flowing through the MOSFET 19 of the first switching device 32. The voltage across the terminals of the current detecting resistance 57 is fed to the comparison circuit 58. The comparison circuit 58 determines whether an overcurrent state exists or not by comparing the voltage across the terminals of the current detecting resistance 57 and a reference voltage, and outputs a determination signal indicative of its determination result. Specifically, the comparison circuit 58 determines that the overcurrent state exists when the voltage across the terminals of the current detecting resistance 57 is larger than the reference voltage (detects an overcurrent).

In a state where the overcurrent detection circuit 56 does not detect the overcurrent (normal state), the second switching circuit 54 selects the first output terminal e and connects the input terminal d to the first output terminal e. Thus, the input terminal d of the second switching circuit 54 is set to a high-impedance state. Further, the first switching circuit 52 selects the first input terminal a and connects the first input terminal a to the output terminal c. Thus, the gate drive signal DG1 generated by the amplifier circuit 51 is fed to the gate terminal 5 of the first switching device 32 via the gate resistance 53. This gate drive signal DG1 drive-controls the MOSFET 19 of the first switching device 32.

When the overcurrent detection circuit 56 detects the overcurrent, the first switching circuit 52 selects the second input terminal b and connects the output terminal c to the second input terminal b. Thus, the output terminal c of the first switching circuit 52 is set to a high-impedance state. Further, the second switching circuit 54 selects the second output terminal f and connects the input terminal d to the second output terminal f. Thus, the input terminal d of the second switching circuit 54 is grounded.

That is, the gate terminal 5 of the first switching device 32 is grounded via the current blocking resistance 55. As a result of this, a gate-to-source voltage Vgs of the first switching device 32 is reduced, and the drain current $I_D$ (short-circuit current) flowing in the MOSFET 19 of the first switching device 32 is blocked. A blocking speed of the short-circuit current changes depending on a resistance value r2 of the current blocking resistance 55. When the resistance value r2 of the current blocking resistance 55 increases, the blocking speed of the short-circuit current decreases. The resistance value r2 of the current blocking resistance 55 is larger than a resistance value r1 of the gate resistance 53. In this embodiment, the resistance value r1 of the gate resistance 53 is, for example, 3.9 [Ω], and resistance value r2 of the current blocking resistance 55 is, for example, 33 [Ω].

While this short-circuit current is blocked by connecting the gate terminal 5 of the first switching device 32 to ground, it takes some time to blocking. For example, around 10 μsec (microsecond) is required from detection of an overcurrent. However, if blocking does not occur within a short-circuit capacity tsc which the first switching device 32 has, thermal destruction of the first switching device 32 may be caused by thermal runaway through the short-circuit current $I_D$.

Therefore, in this embodiment, the external resistance 22 having the resistance value r according to the constituent material, length, wire diameter and the like of the source wire 16 (see FIG. 2) is connected in series between the source terminal of the MOSFET 19 and the sense source terminal 4, as described above.

Thus, in comparison to a case where the sense source terminal 4 is directly connected to the source terminal of the MOSFET 19 as in the conventional wire 21 shown in FIG. 5 with a broken line, the gate-to-source voltage Vgs when an overcurrent $I_D$ flows between gate and source of the MOSFET 19 can be reduced by a voltage drop $(-I_D \cdot r)$ at this external resistance 22.

Figure 6:
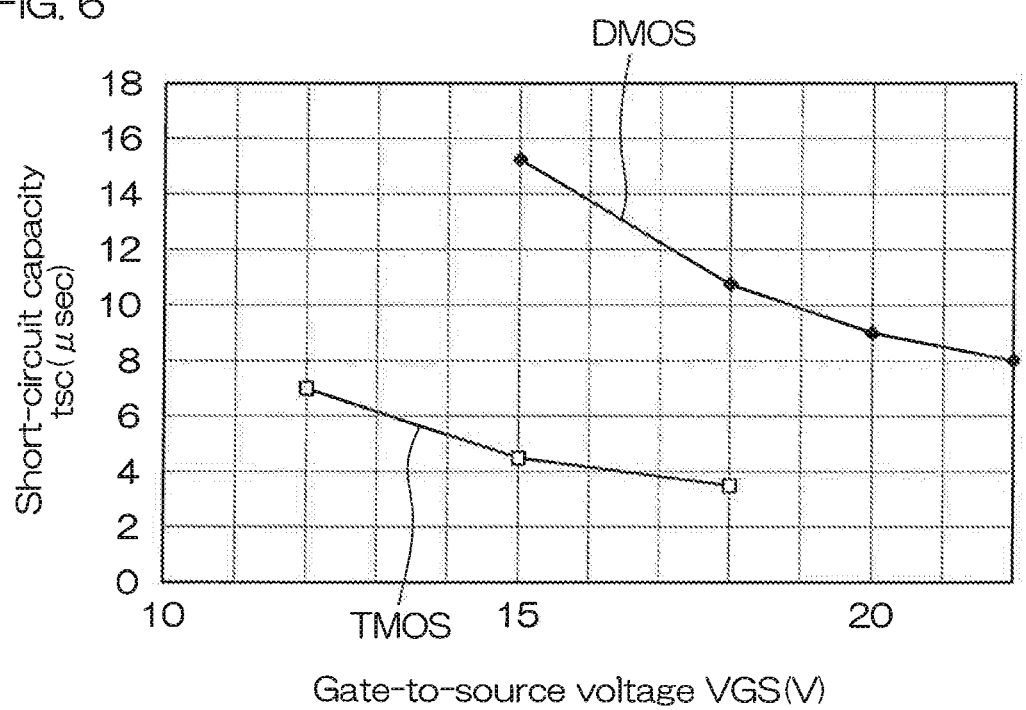
FIG. 6 is a graph showing a relation between a gate-to-source voltage of the switching devices in FIG. 1 and a short-circuit capacity.

FIG. 6 is a graph showing a relation between the gate-to-source voltage Vgs of the switching device 1 in FIG. 1 and the short-circuit capacity tsc. Specifically, results of a short-circuit test are shown where samples of two types of devices having a structure similar to the switching device 1 in FIG. 1 were produced, one of MOSFETs 19 was formed as DMOS (Double-Diffused MOSFET) and the other of the MOSFETs 19 was formed as TMOS (Trench MOSFET).

As shown in FIG. 6, in either of DMOS or TMOS, the short-circuit capacity tsc increases as the gate-to-source voltage Vgs decreases. Accordingly, as shown in FIG. 5, if the gate-to-source voltage Vgs when the overcurrent $I_D$ flows can be reduced by the voltage drop $(-I_D \cdot r)$ at the external resistance 22, this can improve a short-circuit capacity of the first switching device 32. As a result, the short-circuit current $I_D$ can be blocked sufficiently in advance by the grounding of the gate terminal 5.

Moreover, by properly setting a resistance value of the external resistance 22 through appropriately adjusting the constituent material, length, wire diameter and the like of the source wire 16 (see FIG. 2), the voltage drop at the external resistance 22 can be decreased when the drain current $I_D$ flowing between source and drain is relatively small or is a rated value. For example, in this embodiment, the resistance value r of the external resistance 22 is set to $I_D \times \frac{1}{100}$ mΩ to $5 \times I_D \times \frac{1}{100}$ mΩ so that the gate-to-source voltage Vgs becomes around 18.5 V when the drain current $I_D$ is relatively low, the gate-to-source voltage Vgs becomes around 18.0 V when the drain current $I_D$ is the rated value, and the gate-to-source voltage Vgs becomes around 16.5 V when the drain current $I_D$ is four to five times of the rated value. Thus, when the drain current $I_D$ is relatively small or is the rated value, reduction of the gate-to-source voltage Vgs can be suppressed, and a drive voltage necessary and sufficient for a switching operation can be fed to the MOSFET 19. That is, an impact on a switching performance of the MOSFET 19 can be small.

Further, in this embodiment, since the source wire 16 for current output of the switching device 1 is used as the external resistance 22, the effect of the above-described improvement of the short-circuit capacity can be achieved with a low cost without the number of components increased.

Further, in this embodiment, since the external resistance 22 is sealed by the resin package 2, the switching device 1 can be installed in a conventional layout.

While one embodiment of the present invention is described above, the present invention can be implemented in yet other modes.

For example, in the above-described embodiment, a short-circuit current is blocked using one current blocking resistance 55, a plurality of current blocking resistances may be used to change a blocking speed at the time of current blocking in a stepwise manner.

For example, here is described a case where in FIG. 5, the gate resistance 53 is used as a first current blocking resistance and the current blocking resistance 55 is used as a second current blocking resistance when an overcurrent is detected. A resistance value r2 of the second current blocking resistance (current blocking resistance 55) is set larger than a resistance value r1 of the first current blocking resistance (gate resistance 53). For example, the resistance value r1 is 3.9 [Ω], and the resistance value r2 is 33 [Ω].

In this case, as shown in FIG. 5 by a broken line, the first switching circuit 52 has a third input terminal g. The third input terminal g is grounded. Further, as shown in FIG. 5 by a broken line, the first gate drive circuit 36 comprises a voltage monitoring portion 59 monitoring the gate-to-source voltage Vgs of the first switching device 32.

When the overcurrent detection circuit 56 detects an overcurrent, the first switching circuit 52 selects the second input terminal b and connects the output terminal c to the second input terminal b. Thus, the output terminal c of the first switching circuit 52 is set to a high-impedance state. Further, the second switching circuit 54 selects the second output terminal f and connects the input terminal d to the second output terminal f. Thus, the input terminal d of the second switching circuit 54 is grounded.

That is, the gate terminal 5 of the first switching device 32 is grounded via the second current blocking resistance 55. As a result, the gate-to-source voltage Vgs of the first switching device 32 is reduced. In this case, since the resistance value of the second current blocking resistance 55 is set larger than the resistance value of the first current blocking resistance 33, a current blocking speed is slower than in a case where the gate terminal 5 of the first switching device 32 is grounded via the first current blocking resistance 53. When the gate-to-source voltage Vgs decreases and takes a voltage value (in this example, 10 [V]) where a temperature characteristic of an ON resistance of the first switching device 32 becomes negative, the voltage monitoring portion 59 outputs a resistance switching signal to the first switching circuit 52 and the second switching circuit 54.

When receiving the resistance switching signal from the voltage monitoring portion 59, the first switching circuit 52 selects the third input terminal g and connects the output terminal c to the third input terminal g. When receiving the resistance switching signal from the voltage monitoring portion 59, the second switching circuit 54 selects the first output terminal e and connects the input terminal d to the first output terminal e. Thus, the gate terminal 5 of the first switching device 32 is grounded via the first current blocking resistance 53 to decrease the gate-to-source voltage Vgs. Since the resistance value of the first current blocking resistance 53 is smaller than the resistance value of the second current blocking resistance 55, a current blocking speed becomes faster.

Further, in the above-described embodiment, the source wire 16 is used as the external resistance 22 not to increase the component number. However, an island comprising a metal plate or the like is separately provided in the resin package 2, for example, and the sense source terminal 4 and the source pad 13 are connected by at least two wires using this island as a relay point.

Further, in the above-described embodiment, the case where the present invention is applied to an inverter circuit is described. However, the present invention can also be applied to an electronic circuit such as a converter circuit other than an inverter circuit.

FIGS. 7 to 10 show a semiconductor module to which a switching device according to one embodiment of the present invention is applied.

Figure 7:
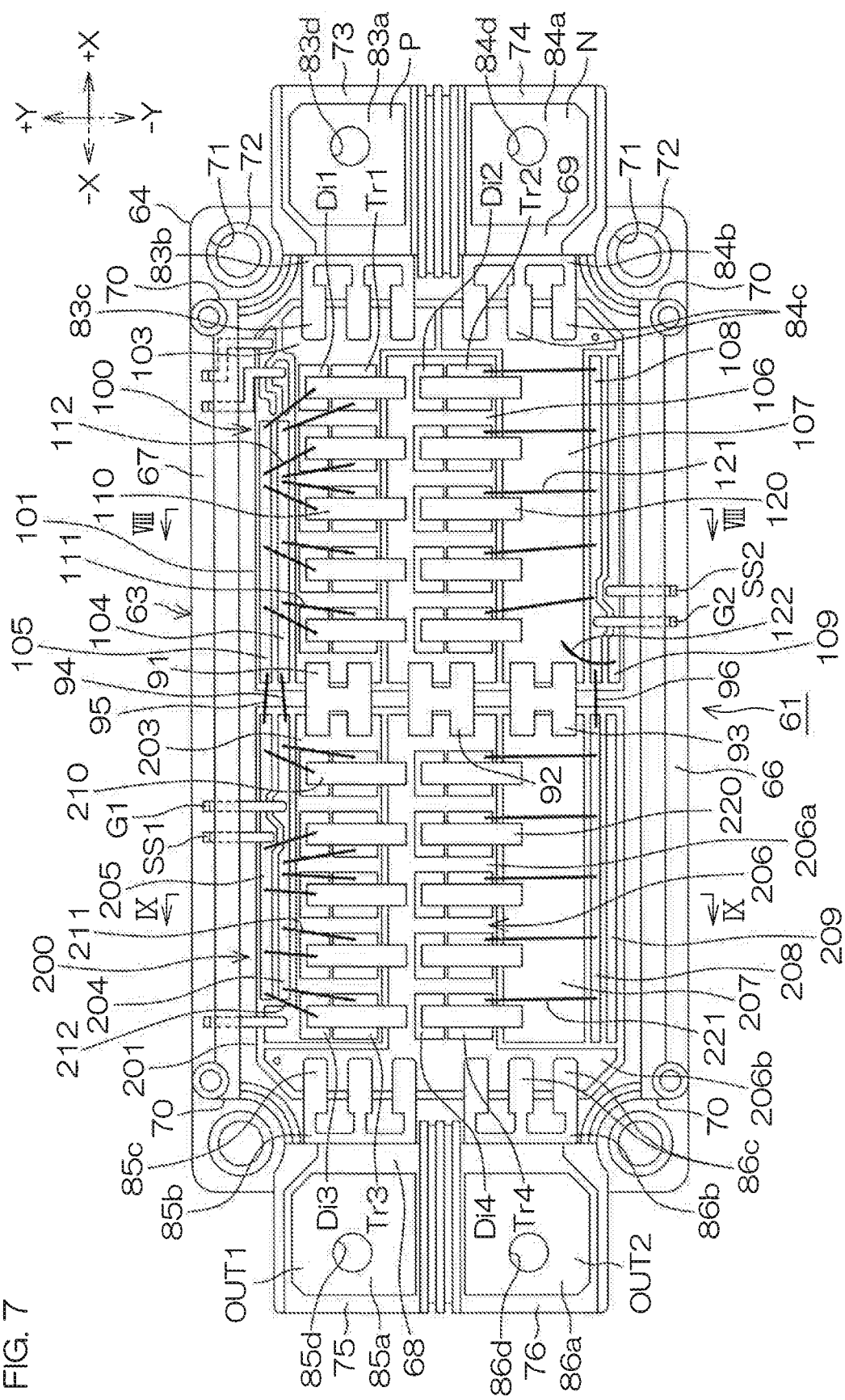
FIG. 7 is a plan view for illustrating a configuration of a semiconductor module.
Figure 8:
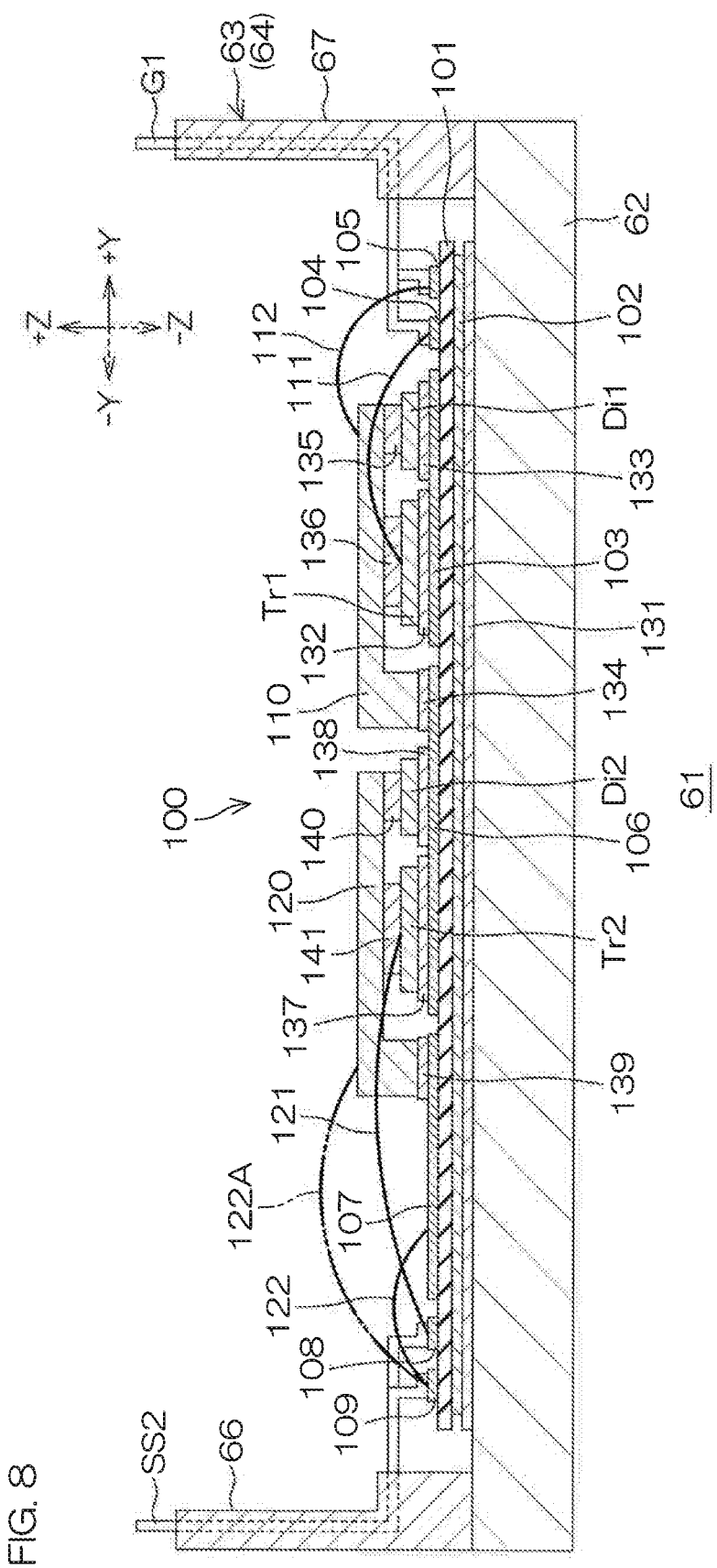
FIG. 8 is a schematic sectional view along a line VIII-VIII in FIG. 7.
Figure 9:
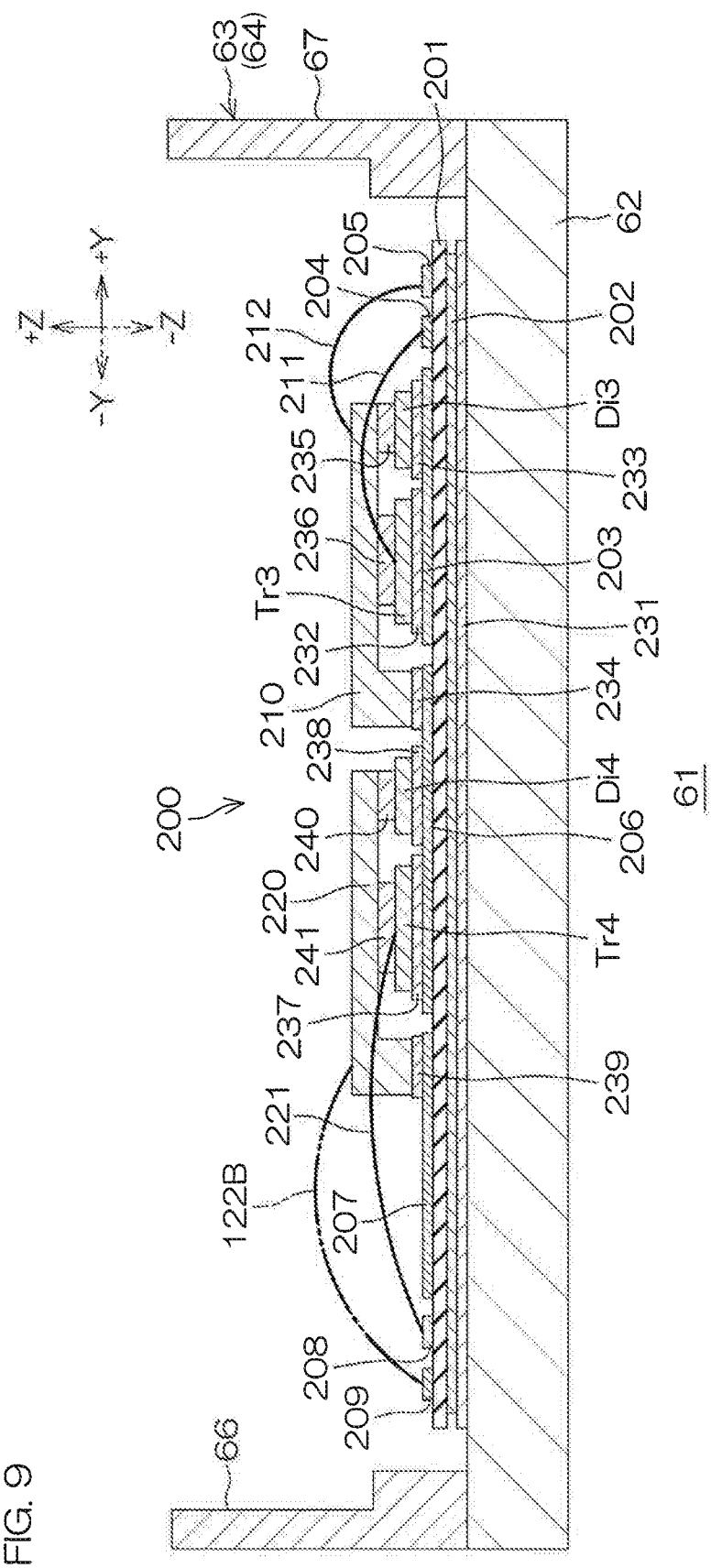
FIG. 9 is a schematic sectional view along a line IX-IX in FIG. 7.

FIG. 7 is a plan view for illustrating a configuration of a semiconductor module, and shows a state where a top plate is removed. FIG. 8 is a schematic sectional view along a line VIII-VIII in FIG. 7. FIG. 9 is a schematic sectional view along a line IX-IX in FIG. 7.

A semiconductor module 61 includes a heat dissipation plate 62, a casing 63, and a plurality of terminals assembled to the casing 63. The plurality of terminals include a first power-supply terminal (positive power-supply terminal, in this example) P, a second power-supply terminal (negative power-supply terminal, in this example) N, as well as a first output terminal OUT1 and a second output terminal OUT2. Further, the plurality of terminals includes a first source sense terminal SS1, a first gate terminal G1, a second source sense terminal SS2 and a second gate terminal G2. When the first output terminal OUT1 and the second output terminal OUT2 are collectively referred to, they are referred to as "output terminal OUT".

For convenience of description, +X direction, −X direction, +Y direction and −Y direction shown in FIG. 7 and +Z direction and −Z direction shown in FIG. 8 are hereinafter sometimes used. The +X direction and the −X direction are two directions along a long side of the casing 63 (heat dissipation plate 62) having a generally rectangular shape in a plan view, and they are collectively called merely "X direction". The +Y direction and the −Y direction are two directions along a short side of the casing 63, and they are collectively called merely "Y direction". The +Z direction and the −Z direction are two directions along a normal line of the casing 63, and they are collectively called merely "Z direction". When the heat dissipation plate 62 is placed on a horizontal plane, the X direction and the Y direction are two horizontal directions (first horizontal direction and second horizontal direction) along two horizontal straight lines (X axis and Y axis) orthogonal to each other, and the Z direction is a vertical direction (height direction) along a vertical line (Z axis).

The heat dissipation plate 62 is a plate-shaped body having an elongated rectangle shape in a plan view and having a uniform thickness, and is formed of a material having a high thermal conductivity. More specifically, the heat dissipation plate 62 may be a copper plate formed of copper. This copper plate may be provided with a nickel plating layer on a surface thereof. If necessary, a heat sink or other cooling means is attached to a surface of the heat dissipation plate 62 on a −Z direction side.

The casing 63 is formed in a generally rectangular parallelepiped shape and is formed of a resin material. In particular, a heat resistant resin such as PPS (polyphenylene sulfide) is preferably used. The casing 63 has a rectangular shape having almost the same size as the heat dissipation plate 62 in a plan view, and comprises a frame portion 64 fastened to one surface (surface on a +Z direction side) of the heat dissipation plate 62, and a top plate (not shown) fastened to this frame portion 64. The top plate closes one side (+Z direction side) of the frame portion 64, and is opposed to one surface of the heat dissipation plate 62 closing the other side (−Z direction side) of the frame portion 64. Thus, a circuit accommodating space is defined in an inside of the casing 63 by the heat dissipation plate 62, the frame portion 64 and the top plate. In this embodiment, the frame portion 64 and the above-described plurality of terminals are formed by simultaneous molding.

The frame portion 64 comprises a pair of side walls 66, 67 and a pair of end walls 68, 69 coupling respective opposite ends of these pair of side walls 66, 67. Four corner portions on a surface of the frame portion 64 on the +Z direction side are provided with recesses 70 opened outwardly. A wall on an opposite side of an outwardly opened portion of each recess 70 curves so as to protrude inwardly. A bottom wall of the recess 70 is provided with an attachment through hole 71 penetrating the bottom wall. A cylindrical metal member 72 is fastened to the attachment through hole 71 in a fitted state. The heat dissipation plate 62 is provided with attachment through holes (not shown) communicating with respective attachment through holes 71. The semiconductor module 61 is fastened by a bolt (not shown) inserted through the attachment through holes 71 of the casing 63 and the heat dissipation plate 62 to a predetermined fastening position of an object to be attached. The above-described cooling means such as a heat sink may be attached using these attachment through holes 71.

An outer surface of the end wall 69 is provided with a terminal board 73 for the first power-supply terminal P and a terminal board 74 for the second power-supply terminal N. In a plan view, the terminal board 73 is disposed on a +Y direction side with respect to a length direction center of the end wall 69, and the terminal board 74 is disposed on a −Y direction side with respect to the length direction center of the end wall 69. These terminal boards 73 and 74 are integrally formed with the end wall 69.

An outer surface of the end wall 68 is provided with a terminal board 75 for the first output terminals OUT1 and a terminal board 76 for the second output terminals OUT2. In a plan view, the terminal board 75 is disposed on the +Y direction side with respect to a length direction center of the end wall 68, and the terminal board 76 is disposed on the −Y direction side with respect to the length direction center of the end wall 68. These terminal boards 75 and 76 are integrally formed with the end wall 68. Nuts (not shown) are respectively embedded in the respective terminal boards 73, 74, 75, 76 in positions where center axis lines of screw holes of the respective nuts correspond to the Z direction.

The first power-supply terminal P is disposed on a surface (surface on the +Z direction side) of the terminal board 73. The second power-supply terminal N is disposed on a surface (surface on the +Z direction side) of the terminal board 74. The first output terminal OUT1 is disposed on a surface (surface on the +Z direction side) of the terminal board 75. The second output terminal OUT2 is disposed on a surface (surface on the +Z direction side) of the terminal board 76.

Each of the first power-supply terminal P, the second power-supply terminal N, the first output terminal OUT1 and the second output terminal OUT2 is formed by cutting out a metal plate (for example, a copper plate provided with a nickel plating) into a predetermined shape to be subjected to bending, and is electrically connected to a circuit in the inside of the casing 63. Respective tip portions of the first power-supply terminal P, the second power-supply terminal N, the first output terminal OUT1 and the second output terminal OUT2 are drawn out on the terminal boards 73, 74, 75, 76. The respective tip portions of the first power-supply terminal P, the second power-supply terminal N, the first output terminal OUT1 and the second output terminal OUT2 are formed so as to be along respective surfaces of the terminal boards 73, 74, 75, 76. The tip portions of the first power-supply terminal P, the second power-supply terminal N, the first output terminal OUT1 and the second output terminal OUT2 are respectively provided with through holes 83*d*, 84*d*, 85*d*, 86*d*. The terminals P, N, OUT1, OUT2 can be connected to bus bars provided on a side of the object to be attached to the semiconductor module 61 by being inserted through these through holes 83*d*, 84*d*, 85*d*, 86*d* and using bolts threaded into the above-described nuts.

The first source sense terminal SS1, the first gate terminal G1 and the like are attached to the one side wall 67. Tip portions of these terminals SS1, G1 protrude from a surface (surface on the +Z direction side) of the side wall 67 outwardly (in the +Z direction) of the casing 63. The first source sense terminal SS1 and the first gate terminal G1 are disposed between an end on a −X direction side and a length direction (X direction) center of the side wall 67 in a manner spaced in the X direction.

The second gate terminal G2 and the second source sense terminal SS2 are attached to the other side wall 66. Tip portions of these terminals G2, SS2 protrude from a surface (surface on the +Z direction side) of the side wall 66 outwardly (in the +Z direction) of the casing 63. The second gate terminal G2 and the second source sense terminal SS2 are disposed between a length direction (X direction) center and an end on the +X direction side of the side wall 66 in a manner spaced in the X direction. Each of the source sense terminals SS1, SS2 and gate terminals G1, G2 is formed by subjecting a metal rod (for example, a copper rod-like body provided with a nickel plating) having a rectangular cross-section to bending, and is electrically connected to the circuit in the inside of the casing 63.

The first power-supply terminal P includes a tip portion 83*a* along the surface of the terminal board 73, a base portion 83*b* disposed parallelly to the tip portion 83*a* on the −Z direction side with respect to the tip portion 83*a*, and a standing portion coupling the tip portion 83*a* and the base portion 83*b*. The standing portion couples an edge portion of the base portion 83*b* on the −Y direction side and an edge portion of the base portion 83*a* on the −Y direction side. Most of the base portion 83*b* and the standing portion of the first power-supply terminal P are embedded in insides of the end wall 69 and the terminal board 73. A comb-shaped terminal 83*c* protruding inwardly of the casing 63 is formed on an end portion of the base portion 83*b* on the −X direction side.

The second power-supply terminal N includes a tip portion 84*a* along the surface of the terminal board 74, a base portion 84*b* disposed parallelly to the tip portion 84*a* on the −Z direction side with respect to the tip portion 84*a*, and a standing portion coupling the tip portion 84*a* and the base portion 84*b*. The standing portion couples an edge portion of the base portion 84*b* on the +Y direction side and an edge portion of the base portion 84*a* on the +Y direction. Most of the base portion 84*b* and the standing portion of the second power-supply terminal N are embedded in insides of the end wall 69 and the terminal board 74. A comb-shaped terminal 84*c* protruding inwardly of the casing 63 is formed on an end portion of the base portion 84*b* on the −X direction side.

The first output terminal OUT1 includes a tip portion 85*a* along the surface of the terminal board 75, a base portion 85*b* disposed parallelly to the tip portion 85*a* on the −Z direction side with respect to the tip portion 85*a*, and a standing portion coupling the tip portion 85*a* and the base portion 85*b*. The standing portion couples an edge portion of the base portion 85*b* on the −Y direction side and an edge portion of the base portion 85*a* on the −Y direction side. Most of the base portion 85*b* and the standing portion of the first output terminal OUT1 are embedded in insides of the end wall 68 and the terminal board 75. A comb-shaped terminal 85*c* protruding inwardly of the casing 63 is formed on an end portion of the base portion 85*b* on the +X direction side.

The second output terminal OUT2 includes a tip portion 86*a* along the surface of the terminal board 76, a base portion 86*b* disposed parallelly to the tip portion 86*a* on the −Z direction side with respect to the tip portion 86*a*, and a standing portion coupling the tip portion 86*a* and the base portion 86*b*. The standing portion couples an edge portion of the base portion 86*b* on the +Y direction side and an edge portion of the base portion 86*a* on the +Y direction side. Most of the base portion 86*b* and the standing portion of the second output terminal OUT2 are embedded in insides of the end wall 68 and the terminal board 76. A comb-shaped terminal 86*c* protruding inwardly of the casing 63 is formed on an end portion of the base portion 86*b* on the +X direction side.

The first source sense terminal SS1 has a crank shape viewed from the X direction, and their intermediate portion is embedded in the side wall 67. A base end portion of the first source sense terminal SS1 is disposed in the casing 63. A tip end portion of the first source sense terminal SS1 protrudes from the surface of the side wall 67 in the +Z direction.

The first gate terminal G1 has a crank shape viewed from the X direction, and their intermediate portion is embedded in the side wall 67. A base end portion of the first gate terminal G1 is disposed in the casing 63. A tip end portion of the first gate terminal G1 protrudes from the surface of the side wall 67 in the +Z direction.

The second source sense terminal SS2 has a crank shape viewed from the X direction, and their intermediate portion is embedded in the side wall 66. A base end portion of the second source sense terminal SS2 is disposed in the casing 63. A tip end portion of the second source sense terminal SS2 protrudes from the surface of the side wall 66 in the +Z direction.

The second gate terminal G2 has a crank shape viewed from the X direction, and their intermediate portion is embedded in the side wall 66. A base end portion of the second gate terminal G2 is disposed in the casing 63. A tip end portion of the second gate terminal G2 protrudes from the surface of the side wall 66 in the +Z direction.

In a region surrounded by the frame portion 64 in the surface (surface on the +Z direction side) of the heat dissipation plate 62, a first assembly 100 and a second assembly 200 are disposed side by side in the X direction. The first assembly 100 is disposed on a side of the power-supply terminals P, N, and the second assembly 200 is disposed on a side of the output terminal OUT. The first assembly 100 configures a half of an upper arm (high side) circuit and a half of a lower arm (low side) circuit. The second assembly 200 configures the other half of the upper arm circuit and the other half of the lower arm circuit.

The first assembly 100 includes a first insulating substrate 101, a plurality of first switching elements Tr1, a plurality of first diode elements Di1, a plurality of second switching elements Tr2 and a plurality of second diode elements Di2.

The first insulating substrate 101 has a generally rectangular shape in a plan view, and four sides thereof are joined to the surface of the heat dissipation plate 62 in positions where the four sides respectively parallel to four sides of the heat dissipation plate 62. A surface (surface on the −Z direction side) of the first insulating substrate 101 on a side of the heat dissipation plate 62 is provided with a first joining conductor layer 102 (see FIG. 8). This first joining conductor layer 102 is joined to the heat dissipation plate 62 via a solder layer 131.

An surface (surface on the +Z direction side) of the first insulating substrate 101 on a side opposite to the heat dissipation plate 62 is provided with a plurality of conductor layers for the upper arm circuit and a plurality of conductor layers for the lower arm circuit. The plurality of conductor layers for the upper arm circuit includes a first element joining conductor layer 103, a first gate terminal conductor layer 104 and a first source-sense-terminal conductor layer 105. The plurality of conductor layers for the lower arm circuit includes a second element joining conductor layer 106, an N-terminal conductor layer 107, a second gate terminal conductor layer 108 and a second source-sense-terminal conductor layer 109.

In this embodiment, the first insulating substrate 101 is formed of AlN. For example, a substrate where copper foils are directly joined to opposite surfaces of ceramics (DBC: Direct Bonding Copper) can be used as the first insulating substrate 101. When a DBC substrate is used as the first insulating substrate 101, the respective conductor layers 102 to 109 are formed by the copper foils.

The first element joining conductor layer 103 is disposed near a side on the +Y direction side on a surface of the first insulating substrate 101, and has a rectangular shape elongated in the X direction in a plan view. The first element joining conductor layer 103 has on an end portion thereof on the +X direction side a protruding portion extending in the −Y direction. The N-terminal conductor layer 107 is disposed near a side on the −Y direction side on the surface of the first insulating substrate 101, and has a rectangular shape elongated in the X direction in a plan view. The N-terminal conductor layer 107 has on an end portion thereof on the +X direction side a protruding portion extending toward the protruding portion of the first element joining conductor layer 103. The second element joining conductor layer 106 is disposed on a region surrounded by the first element joining conductor layer 103, the N-terminal conductor layer 107 and a side of the first insulating substrate 101 on the −X direction side in a plan view, and has a rectangular shape elongated in the X direction in a plan view.

The first gate terminal conductor layer 104 is disposed between the first element joining conductor layer 103 and the side of the first insulating substrate 101 on the +Y direction side, and has a rectangular shape elongated in the X direction in a plan view. The first source-sense-terminal conductor layer 105 is disposed between the first gate terminal conductor layer 104 and the side of the first insulating substrate 101 on the +Y direction side, and has a rectangular shape elongated in the X direction in a plan view.

The second gate terminal conductor layer 108 is disposed between the N-terminal conductor layer 107 and the side of the first insulating substrate 101 on the −Y direction side, and has a rectangular shape elongated in the X direction in a plan view. The second source-sense-terminal conductor layer 109 is disposed between the second gate terminal conductor layer 108 and the side of the first insulating substrate 101 on the −Y direction side, and has a rectangular shape elongated in the X direction in a plan view.

The comb-shaped terminal 83c of the first power-supply terminal P is joined to an end portion on the +X direction side on a surface of the first element joining conductor layer 103. The comb-shaped terminal 84c of the second power-supply terminal N is joined to an end portion on the +X direction side on a surface of the N-terminal conductor layer 107. A terminal of the first power-supply terminal P has a comb shape like the comb-shaped terminal 83c. Therefore, when the first power-supply terminal P is joined to the first element joining conductor layer 103, the comb-shaped terminal 83c can easily be ultrasonically joined to the first element joining conductor layer 103 by pressing a head for ultrasonic joining against a tip of the comb-shaped terminal 83c, for example. Further, a terminal of the second power-supply terminal N has a comb shape like the comb-shaped terminal 84c. Therefore, when the second power-supply terminal N is joined to the N-terminal conductor layer 107, the comb-shaped terminal 84c can easily be ultrasonically joined to the N-terminal conductor layer 107 by pressing a head for ultrasonic joining against a tip of the comb-shaped terminal 84c, for example. The base end portion of the second gate terminal G2 is joined to the second gate terminal conductor layer 108. The base end portion of the second source sense terminal SS2 is joined to the second source-sense-terminal conductor layer 109. Joining of them may be performed by ultrasonic joining.

To the surface of the first element joining conductor layer 103, drain electrodes of the plurality of first switching elements Tr1 are joined via a solder layer 132 (see FIG. 8), and at the same time, cathode electrodes of the plurality of first diode elements Di1 are joined via a solder layer 133. Each first switching element Tr1 has a source electrode and a gate electrode on a surface opposite to a surface joined to the first element joining conductor layer 103. Each first diode element Di1 has an anode electrode on a surface opposite to a surface joined to the first element joining conductor layer 103.

Near a side on the +Y direction side on the surface of the first element joining conductor layer 103, five first diode elements Di1 are disposed side by side in a manner spaced in the X direction. Further, between a side of a first element joining conductor layer 103 on the −Y direction side and the five first diode elements Di1, five first switching elements Tr1 are disposed side by side in a manner spaced in the X direction. The five first switching elements Tr1 are aligned with the five first diode elements Di1 with respect to the Y direction.

The first switching element Tr1 and the first diode element Di1 aligned in the Y direction are connected to the second element joining conductor layer 106 by a first connection metal member 110 extending generally in the Y direction in a plan view. The first connection metal member 110 comprises a block-shaped standing portion whose base end portion is joined to the second element joining conductor layer 106 via a solder 134 and whose tip end portion extends in the +Z direction, and a plate-shaped traverse portion extending from the tip end portion of the standing portion in the +Y direction and disposed above the first switching element Tr1 and the first diode element Di1. A tip end portion of the traverse portion is joined to the anode electrode of the first diode element Di1 via a solder 135, and a length intermediate portion of the traverse portion is joined to the source electrode of the first switching element Tr1 via a solder 136. A width (length in the X direction) of the first connection metal member 110 is shorter than a width (length in the X direction) of the first switching element Tr1. The traverse portion of the first connection metal member 110 passes an intermediate portion of the width of the first switching element Tr1 in a plan view.

The gate electrode of each first switching element Tr1 is connected to the first gate terminal conductor layer 104 via a wire 111. Each first connection metal member 110 is connected to the first source-sense-terminal conductor layer 105 via a wire 112. That is, the source electrode of each first switching element Tr1 is connected to the first source-sense-terminal conductor layer 105 via the solder 136, the first connection metal member 110 and the wire 112.

To the surface of the second element joining conductor layer 106, drain electrodes of the plurality of second switching elements Tr2 are connected via a solder layer 137 (see FIG. 8), and at the same time, cathode electrodes of the plurality of second diode elements Di2 are connected via a solder layer 138. Each second switching element Tr2 has a source electrode and a gate electrode on a surface opposite to a surface joined to the second element joining conductor layer 106. Each second diode element Di2 has an anode electrode on a surface opposite to a surface joined to the second element joining conductor layer 106.

Near a side on the −Y direction side on the surface of the second element joining conductor layer 106, five second switching elements Tr2 are disposed side by side in a manner spaced in the X direction. Further, between a side of the second element joining conductor layer 106 on the +Y direction side and the five second switching elements Tr2, five second diode elements Di2 are disposed side by side in a manner spaced in the X direction. The five second diode elements Di2 are aligned with the five second switching elements Tr2 with respect to the Y direction. Further, the five second diode elements Di2 are also aligned with the five first switching elements Tr1 with respect to the Y direction.

The second switching element Tr2 and the second diode element Di2 aligned in the Y direction are connected to the N-terminal conductor layer 107 by a second connection metal member 120 extending generally in the Y direction in a plan view. The second connection metal member 120 comprises a block-shaped standing portion whose base end portion is joined to the N-terminal conductor layer 107 via a solder 139 and whose tip end portion extends in the +Z direction, and a plate-shaped traverse portion extending from the tip end portion of the standing portion in the +Y direction and disposed above the second switching element Tr2 and the second diode element Di2. A tip end portion of the traverse portion is joined to the anode electrode of the second diode element Di2 via a solder 140, and a length intermediate portion of the traverse portion is joined to the source electrode of the second switching element Tr2 via a solder 141. A width (length in the X direction) of the second connection metal member 120 is shorter than a width (length in the X direction) of the second switching element Tr2. The traverse portion of the second connection metal member 120 passes an intermediate portion of the width of the second switching element Tr2 in a plan view.

The gate electrode of each second switching element Tr2 is connected to the second gate terminal conductor layer 108 via a wire 121. The N-terminal conductor layer 107 is connected to the second source-sense-terminal conductor layer 109 via a wire 122. That is, the source electrode of each second switching element Tr2 is connected to the second source-sense-terminal conductor layer 109 via the solder 141, the second connection metal member 120, the N-terminal conductor layer 107 and the wire 122.

The second assembly 200 includes a second insulating substrate 201, a plurality of third switching elements Tr3, a plurality of third diode elements Di3, a plurality of fourth switching elements Tr4 and a plurality of fourth diode elements Di4.

The second insulating substrate 201 has a generally rectangular shape in a plan view, and four sides thereof are joined to the surface of the heat dissipation plate 62 in positions where the four sides respectively parallel to four sides of the heat dissipation plate 62. A surface (surface on the −Z direction side) of the second insulating substrate 201 on the side of the heat dissipation plate 62 is provided with a second joining conductor layer 202 (see FIG. 9). This second joining conductor layer is joined to the heat dissipation plate 62 via a solder layer 231.

An surface (surface on the +Z direction side) of the second insulating substrate 201 on a side opposite to the heat dissipation plate 62 is provided with a plurality of conductor layers for the upper arm circuit and a plurality of conductor layers for the lower arm circuit. The plurality of conductor layers for the upper arm circuit include a third element joining conductor layer 203, a third gate terminal conductor layer 204 and a third source-sense-terminal conductor layer 205. The plurality of conductor layers for the lower arm circuit include a fourth element joining conductor layer 206, an source conductor layer 207, a fourth gate terminal conductor layer 208 and a fourth source-sense-terminal conductor layer 209.

In this embodiment, the second insulating substrate 201 is formed of AlN. For example, a substrate where copper foils are directly joined to opposite surfaces of ceramics (DBC: Direct Bonding Copper) can be used as the second insulating substrate 201. When a DBC substrate is used as the second insulating substrate 201, the respective conductor layers 202 to 209 are formed by the copper foils.

The third element joining conductor layer 203 is disposed near a side on the +Y direction side on a surface of the second insulating substrate 201, and has a rectangular shape elongated in the X direction in a plan view. The third element joining conductor layer 203 has on an end portion thereof on the −X direction side a protruding portion extending in the +Y direction. The source conductor layer 207 is disposed near a side on the −Y direction side on the surface of the second insulating substrate 201, and has a rectangular shape elongated in the X direction in a plan view. The fourth element joining conductor layer 206 has a T shape in a plan view, is disposed between the third element joining conductor layer 203 and the source conductor layer 207, and includes an element joining portion 206a having a rectangular shape elongated in the X direction in a plan view and an output terminal joining portion 206b extending along a side of the second insulating substrate 201 on the −X direction side. An end portion of the element joining portion 206a on the −X direction side is coupled to a length center portion of the output terminal joining portion 206b.

The third gate terminal conductor layer 204 is disposed between the third element joining conductor layer 203 and a side of the second insulating substrate 201 on the +Y direction side, and has a rectangular shape elongated in the X direction in a plan view. The third source-sense-terminal conductor layer 205 is disposed between the third gate terminal conductor layer 204 and the side of the second insulating substrate 201 on the +Y direction side, and has a rectangular shape elongated in the X direction in a plan view.

The fourth gate terminal conductor layer 208 is disposed between the source conductor layer 207 and the side of the second insulating substrate 201 on the −Y direction side, and has a rectangular shape elongated in the X direction in a plan view. The fourth source-sense-terminal conductor layer 209 is disposed between the fourth gate terminal conductor layer 208 and the side of the second insulating substrate 201 on the −Y direction side, and has a rectangular shape elongated in the X direction in a plan view.

The comb-shaped terminal 85c of the first output terminal OUT1 and the comb-shaped terminal 86c of the second output terminal OUT2 are joined to a surface of the output terminal joining portion 206b of the fourth element joining conductor layer 206. A terminal of the first output terminal OUT1 has a comb shape like the comb-shaped terminal 85c. Therefore, when the first output terminal OUT1 is joined to the output terminal joining portion 206b, the comb-shaped terminal 85c can easily be ultrasonically joined to the output terminal joining portion 206b by pressing a head for ultrasonic joining against a tip of the comb-shaped terminal 85c, for example. Further, a terminal of the second output terminal OUT2 has a comb shape like the comb-shaped terminal 86c. Therefore, when the second output terminal OUT2 is joined to the output terminal joining portion 206b, the comb-shaped terminal 86c can easily be ultrasonically joined to the output terminal joining portion 206b by pressing a head for ultrasonic joining against a tip of the comb-shaped terminal 86c, for example. The base end portion of the first gate terminal G1 is joined to the third gate terminal conductor layer 204. The base end portion of the first source sense terminal SS1 is joined to the third source-sense-terminal conductor layer 205. Joining of them may be performed by ultrasonic joining.

To a surface of the third element joining conductor layer 203, drain electrodes of the plurality of third switching elements Tr3 are joined via a solder layer 232 (see FIG. 9), and at the same time, cathode electrodes of the plurality of third diode elements Di3 are joined via a solder layer 233. Each third switching element Tr3 has a source electrode and a gate electrode on a surface opposite to a surface joined to the third element joining conductor layer 203. Each third diode element Di3 has an anode electrode on a surface opposite to a surface joined to the third element joining conductor layer 203.

Near a side on the +Y direction side on the surface of the third element joining conductor layer 203, five third diode elements Di3 are disposed side by side in a manner spaced in the X direction. Further, between a side of the third element joining conductor layer 203 on the −Y direction side and the five third diode elements Di3, five third switching elements Tr3 are disposed side by side in a manner spaced in the X direction. The five third switching elements Tr3 are aligned with the five third diode elements Di3 with respect to the Y direction.

The third switching element Tr3 and the third diode element Di3 aligned in the Y direction are connected to the fourth element joining conductor layer 206 by a third connection metal member 210 extending generally in the Y direction in a plan view. The third connection metal member 210 comprises a block-shaped standing portion whose base end portion is joined to the fourth element joining conductor layer 206 via a solder 234 and whose tip end portion extends in the +Z direction, and a plate-shaped traverse portion extending from the tip end portion of the standing portion in the +Y direction and disposed above the third switching element Tr3 and the third diode element Di3. A tip end portion of the traverse portion is joined to the anode electrode of the third diode element Di3 via a solder 235, and a length intermediate portion of the traverse portion is joined to the source electrode of the third switching element Tr3 via a solder 236. A width (length in the X direction) of the third connection metal member 210 is shorter than a width (length in the X direction) of the third switching element Tr3. The traverse portion of the third connection metal member 210 passes an intermediate portion of the width of the third switching element Tr3 in a plan view.

The gate electrode of each third switching element Tr3 is connected to the third gate terminal conductor layer 204 via a wire 211. Each third connection metal member 210 is connected to the third source-sense-terminal conductor layer 205 via a wire 212. That is, the source electrode of each third switching element Tr3 is connected to the third source-sense-terminal conductor layer 205 via the solder 236, the third connection metal member 210 and the wire 212.

To the surface of the fourth element joining conductor layer 206, drain electrodes of the plurality of fourth switching elements Tr4 are connected via a solder layer 237 (see FIG. 9), and at the same time, cathode electrodes of the plurality of fourth diode elements Di4 are connected via a solder layer 238. Each fourth switching element Tr4 has a source electrode and a gate electrode on a surface opposite to a surface joined to the fourth element joining conductor layer 206. Each fourth diode element Di4 has an anode electrode on a surface opposite to a surface joined to the fourth element joining conductor layer 206.

Near a side on the −Y direction side on the surface of the fourth element joining conductor layer 206, five fourth switching elements Tr4 are disposed side by side in a manner spaced in the X direction. Further, between a side of the fourth element joining conductor layer 206 on the +Y direction side and the five fourth switching elements Tr4, five fourth diode elements Di4 are disposed side by side in a manner spaced in the X direction. The five fourth diode elements Di4 are aligned with the five fourth switching elements Tr4 with respect to the Y direction. Further, the five fourth diode elements Di4 are also aligned with the five third switching elements Tr3 with respect to the Y direction.

The fourth switching element Tr4 and the fourth diode element Di4 aligned in the Y direction are connected to the source conductor layer 207 by a fourth connection metal member 220 extending generally in the Y direction in a plan view. The fourth connection metal member 220 comprises a block-shaped standing portion whose base end portion is joined to the source conductor layer 207 via a solder 239 and whose tip end portion extends in the +Z direction, and a plate-shaped traverse portion extending from the tip end portion of the standing portion and disposed above the fourth switching element Tr4 and the fourth diode element Di4. The tip end portion of the traverse portion is joined to the anode electrode of the fourth diode element Di4 via a solder 240, and a length intermediate portion of the traverse portion is joined to the source electrode of the fourth switching element Tr4 via a solder 241. A width (length in the X direction) of the fourth connection metal member 220 is shorter than a width (length in the X direction) of the fourth switching element Tr4. The traverse portion of the fourth connection metal member 220 passes an intermediate portion of the width of the fourth switching element Tr4 in a plan view.

The gate electrode of each fourth switching element Tr4 is connected to the fourth gate terminal conductor layer 208 via a wire 221.

The third element joining conductor layer 203 of the second assembly 200 is connected to the first element joining conductor layer 103 of the first assembly 100 by a first conductor layer connecting member 91. The first conductor layer connecting member 91 comprises a plate-shaped body having an H shape in a plan view, and is formed of a pair of rectangular portions across the third element joining conductor layer 203 and the first element joining conductor layer 103 as well as a linking portion linking center portions of these rectangular portions. Since the first element joining conductor layer 103 and the third element joining conductor layer 203 are connected by the first conductor layer connecting member 91, reduction in inductance can be planned to achieve in comparison to a case of connecting by a wire, for example. Further, the first conductor layer connecting member 91 has the H shape in a plan view, and a terminal of the first conductor layer connecting member 91 has a comb shape. Therefore, when the first conductor layer connecting member 91 is joined to the first element joining conductor layer 103, for example, the first conductor layer connecting member 91 can easily be ultrasonically joined to the first element joining conductor layer 103 by pressing a head for ultrasonic joining against a tip of the first conductor layer connecting member 91.

The fourth element joining conductor layer 206 of the second assembly 200 is connected to the second element joining conductor layer 106 of the first assembly 100 by a second conductor layer connecting member 92. The second conductor layer connecting member 92 comprises a plate-shaped body having an H shape in a plan view, and is formed of a pair of rectangular portions across the fourth element joining conductor layer 206 and the second element joining conductor layer 106 as well as a linking portion linking center portions of these rectangular portions. Since the second element joining conductor layer 106 and the fourth element joining conductor layer 206 are connected by the second conductor layer connecting member 92, reduction in inductance can be planned to achieve in comparison to a case of connecting by a wire, for example. Further, the second conductor layer connecting member 92 has the H shape in a plan view, and a terminal of the second conductor layer connecting member 92 has a comb shape. Therefore, when the second conductor layer connecting member 92 is joined to the second element joining conductor layer 106, for example, the second conductor layer connecting member 92 can easily be ultrasonically joined to the second element joining conductor layer 106 by pressing a head for ultrasonic joining against a tip of the second conductor layer connecting member 92.

The source conductor layer 207 of the second assembly 200 is connected to the N-terminal conductor layer 107 of the first assembly 100 by a third conductor layer connecting member 93. The third conductor layer connecting member 93 comprises a plate-shaped body having an H shape in a plan view, and is formed of a pair of rectangular portions across the source conductor layer 207 and the N-terminal conductor layer 107 as well as a linking portion linking center portions of these rectangular portions. Since the N-terminal conductor layer 107 and the source conductor layer 207 are connected by the third conductor layer connecting member 93, reduction in inductance can be planned to achieve in comparison to a case of connecting by a wire, for example. Further, the third conductor layer connecting member 93 has the H shape in a plan view, and a terminal of the third conductor layer connecting member 93 has a comb shape. Therefore, when the third conductor layer connecting member 93 is joined to the N-terminal conductor layer 107, for example, the third conductor layer connecting member 93 can easily be ultrasonically joined to the N-terminal conductor layer 107 by pressing a head for ultrasonic joining against a tip of the third conductor layer connecting member 93.

The third gate terminal conductor layer 204 of the second assembly 200 is connected to the first gate terminal conductor layer 104 of the first assembly 100 via a wire 94. The third source-sense-terminal conductor layer 205 of the second assembly 200 is connected to the first source-sense-terminal conductor layer 105 of the first assembly 100 via a wire 95.

The fourth gate terminal conductor layer 208 of the second assembly 200 is connected to the second gate terminal conductor layer 108 of the first assembly 100 via a wire 96.

Figure 10:
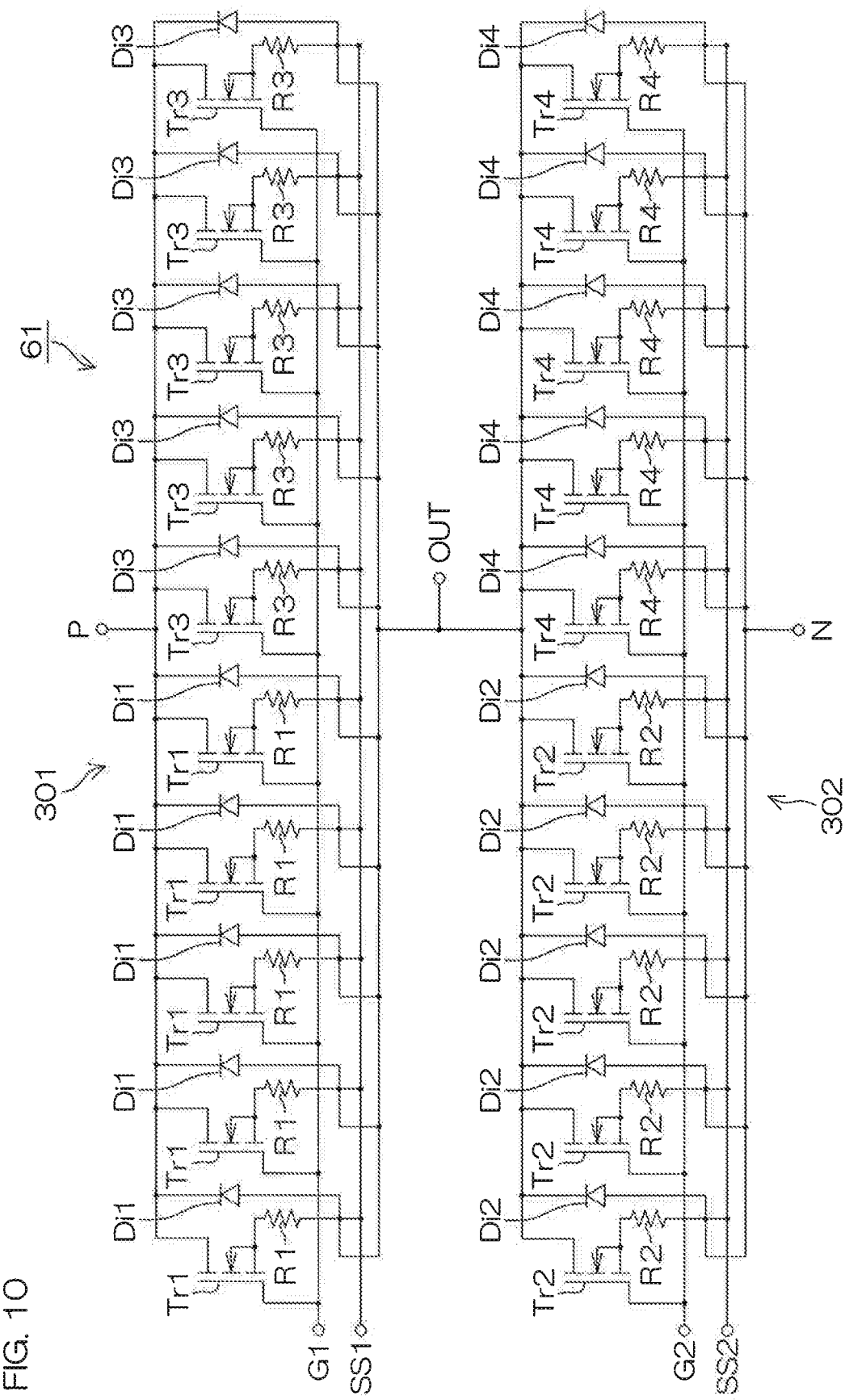
FIG. 10 is an electrical circuit diagram showing an electrical configuration of the semiconductor module in FIG. 7.

FIG. 10 is an electrical circuit diagram showing an electrical configuration of the semiconductor module 61. FIG. 10 shows the two output terminals OUT1, OUT2 as one output terminal OUT.

The plurality of first switching elements Tr1 and the plurality of first diode elements Di1 provided on the first assembly 100 as well as the plurality of third switching elements Tr3 and the plurality of third diode elements Di3 provided on the second assembly 200 are parallelly connected between the first power-supply terminal P and the output terminal OUT to form an upper arm circuit (high side circuit) 301. The plurality of second switching elements Tr2 and the plurality of second diode elements Di2 provided on the first assembly 100 as well as the plurality of fourth switching elements Tr4 and the plurality of fourth diode elements Di4 provided on the second assembly 200 are connected between the output terminal OUT and the second power-supply terminal N to form a lower arm circuit (low side circuit) 302.

The upper arm circuit 301 and the lower arm circuit 302 are connected in series between the first power-supply terminal P and the second power-supply terminal N, and the output terminal OUT is connected to a connecting point 303 between the upper arm circuit 301 and the lower arm circuit 302. Thus, a half bridge circuit is configured. This half bridge circuit can be used as a single-phase bridge circuit. Further, a multi-phase (for example, three-phase) bridge circuit can be configured by parallelly connecting a plurality (for example, three) of the half bridge circuits (semiconductor module 1) to the power source.

In this embodiment, the first to fourth switching elements Tr1 to Tr4 are configured of N-channel DMOS (Double-Diffused Metal Oxide Semiconductor) field effect transistors. In particular, in this embodiment, the first to fourth switching elements Tr1 to Tr4 are high-speed switching MOSFETs formed of SiC semiconductor devices (SiC-DMOS).

Further, in this embodiment, the first to fourth diode elements Di1 to Di4 are configured of schottky barrier diodes (SBD). In particular, in this embodiment, the first to fourth diode elements Di1 to Di4 are configured of SiC semiconductor devices (SiC-SBD).

The first diode element Di1 is parallelly connected to each first switching element Tr1. The third diode element Di3 is parallelly connected to each third switching element Tr3. The respective drains of each first switching element Tr1 and each third switching element Tr3 as well as the respective cathodes of each first diode element Di1 and each third diode element Di3 are connected to the first power-supply terminal P.

The anodes of the plurality of first diode elements Di1 are connected to the sources of the corresponding first switching elements Tr1, and the sources of the first switching elements Tr1 are connected to the output terminal OUT. Similarly, the anodes of the plurality of third diode elements Di3 are connected to the sources of the corresponding third switching elements Tr3, and the sources of the third switching elements Tr3 are connected to the output terminal OUT.

The gates of the plurality of first diode elements Di1 and the plurality of third diode elements Di3 are connected to the first gate terminal G1. The sources of the plurality of first switching elements Tr1 and the third switching elements Tr3 are also connected to the first source sense terminal SS1.

The source of the first switching element Tr1 is connected to the first source sense terminal SS1 via the solder 136, the first connection metal member 110, the wire 112, the first source-sense-terminal conductor layer 105, the wire 95 and the third source-sense-terminal conductor layer 205. Therefore, there exists between the source of the first switching element Tr1 and the first source sense terminal SS1 a wiring resistance including a resistance (external resistance) R1 parasiting in a current path formed of the solder 136 and the first connection metal member 110. In this embodiment, the wiring resistance between the source of the first switching element Tr1 and the first source sense terminal SS1 is larger by an amount of the external resistance R1 in comparison to a case of directly connecting one end of the wire 112 to the source of the first switching element Tr1.

Further, the source of the third switching element Tr3 is connected to the first source sense terminal SS1 via the solder 236, the third connection metal member 210, the wire 212 and the third source-sense-terminal conductor layer 205. Therefore, there exists between the source of the third switching element Tr3 and the first source sense terminal SS1 a wiring resistance including a resistance (external resistance) R3 parasiting in a current path formed of the solder 236 and the third connection metal member 210. In this embodiment, the wiring resistance between the source of the third switching element Tr3 and the first source sense terminal SS1 is larger by an amount of the external resistance R3 in comparison to a case of directly connecting one end of the wire 212 to the source of the third switching element Tr3.

The second diode element Di2 is parallelly connected to each second switching element Tr2. The fourth diode element Di4 is parallelly connected to each fourth switching element Tr4. The respective drains of each second switching element Tr2 and each fourth switching element Tr4 as well as the respective cathodes of each second diode element Di2 and each fourth diode element Di4 are connected to the output terminal OUT.

The anodes of the plurality of second diode elements Di2 are connected to the sources of the corresponding second switching elements Tr2, and the sources of the second switching elements Tr2 are connected to the second power-supply terminal N. Similarly, the anodes of the plurality of fourth diode elements Di4 are connected to the sources of the corresponding fourth switching elements Tr4, and the sources of the fourth switching elements Tr4 are connected to the second power-supply terminal N.

The gates of the plurality of second diode elements Di2 and the plurality of fourth diode elements Di4 are connected to the second gate terminal G2. The sources of the plurality of second switching elements Tr2 and the fourth switching elements Tr4 are also connected to the second source sense terminal SS2.

The source of the second switching element Tr2 is connected to the second source sense terminal SS2 via the solder 141, the second connection metal member 120, the N-terminal conductor layer 107, the wire 122 and the second source-sense-terminal conductor layer 109. Therefore, there exists between the source of the second switching element Tr2 and the second source sense terminal SS2 a wiring resistance including a resistance (external resistance) R2 parasiting in a current path formed of the solder 141, the second connection metal member 120 and the N-terminal conductor layer 107. In this embodiment, the wiring resistance between the source of the second switching element Tr2 and the second source sense terminal SS2 is larger by an amount of the external resistance R2 in comparison to a case of directly connecting one end of the wire 212 to the source of the second switching element Tr2.

Further, the source of the fourth switching element Tr4 is connected to the second source sense terminal SS2 via the solder 241, the fourth connection metal member 220, the source conductor layer 207, the third conductor layer connecting member 93, the N-terminal conductor layer 107, the wire 122 and the second source-sense-terminal conductor layer 109. Therefore, there exists between the source of the fourth switching element Tr4 and the second source sense terminal SS2 a wiring resistance including a resistance (external resistance) R4 parasiting in a current path formed of the solder 241, the fourth connection metal member 220, the third conductor layer connecting member 93 and the N-terminal conductor layer 107. In this embodiment, the wiring resistance between the source of the fourth switching element Tr4 and the second source sense terminal SS2 is larger by an amount of the external resistance R4 in comparison to a case of directly connecting the source of the fourth switching element Tr4 and the second source-sense-terminal conductor layer 109 by a wire.

In place of connecting the N-terminal conductor layer 107 to the second source-sense-terminal conductor layer 109 by the wire 122, each second connection metal member 120 may be connected to the second source-sense-terminal conductor layer 109 by a wire 122A, as shown in FIG. 8 by a two-dot chain line. In this case, as shown in FIG. 9 by a two-dot chain line, each fourth connection metal member 220 can be connected to the fourth source-sense-terminal conductor layer 209 by a wire 122B, and at the same time, the fourth source-sense-terminal conductor layer 209 can be connected to the second source-sense-terminal conductor layer 109 by a wire not shown.

While the embodiments of the present invention are described in detail, these are only specific examples used for clarifying technical contents of the present invention, and the present invention should not be construed as being limited to these specific examples, but is only limited by the scope of the appended claims.

This application corresponds to Japanese Patent Application No. 2013-240105 filed in Japan Patent Office on Nov. 20, 2013, the entire disclosure of which is incorporated herein by reference.

DESCRIPTION OF SYMBOLS 1 switching device
2 resin package
3 source terminal
4 sense source terminal
5 gate terminal
6 drain terminal
11 semiconductor chip
12 drain pad
13 source pad
14 gate pad
16 source wire
17 sense source wire
19 MOSFET
22, R1 to R4 external resistances
31 inverter circuit
32 first switching device
33 second switching device
34 third switching device
35 fourth switching device
40 control section
41 power supply
42 load
51 amplifier circuit
52 first switching circuit
53 gate resistance
54 second switching circuit
55 current blocking resistance
56 overcurrent detection circuit
57 current detecting resistance
58 comparison circuit
59 voltage monitoring portion
61 semiconductor module
Tr1 to Tr4 switching elements
Di1 to Di4 Di1 to Di4

The invention claimed is:

1. A switching device including:
a switching element having a gate electrode, a first output electrode, and a second output electrode;
a second output terminal electrically connected to the second output electrode and having an island on which the switching element is mounted;
a gate terminal electrically connected to the gate electrode;
a first output terminal electrically connected to the first output electrode;
a third output terminal electrically connected to the first output electrode and spaced apart from the first output terminal, and
a resin package sealing the switching element, a part of the gate terminal, a part of the first output terminal, a part of the third output terminal and a part of the second output terminal;
wherein
the gate terminal, the first output terminal, the third output terminal and the second output terminal each include a sealing portion sealed in the resin package and a terminal portion protruding in the same direction with respect to the resin package and protruding therefrom,
the distance between the terminal portion of the first output terminal and the terminal portion of the second output terminal is greater than the distance between the terminal portion of the third output terminal and the terminal portion of the gate terminal.

2. The switching device according to claim 1, wherein the first output electrode is a source electrode, and the second output electrode is a drain electrode.

3. The switching device according to claim 1, wherein the switching element includes a plurality of FETs connected in parallel.

4. The switching device according to claim 2, wherein the third output terminal is a sense source terminal.

5. The switching device according to claim 1, wherein the distance between the terminal portion of the first output terminal and the terminal portion of the second output terminal is greater than the minimum distance among adjacent terminal portions in the first output terminal, the second output terminal, the third output terminal, and the gate terminal.

6. The switching device according to claim 1, wherein the first output electrode is a emitter electrode, and the second output electrode is a collector electrode.

7. The switching device according to claim 1, wherein the switching element is a SiC switching element.

8. The switching device according to claim 1, wherein the resistance value between the first output terminal and the first output electrode is smaller than the resistance value between the third output terminal and the first output electrode.

9. The switching device according to claim 1, wherein a distance between a terminal portion of the first output terminal and a terminal portion of the second output terminal is greater than a distance between a sealing portion of the first output terminal and a sealing portion of the second output terminal.

10. The switching device according to claim 1, wherein the island of the second output terminal is included in a sealing portion of the second output terminal, the first output terminal has an island wider in width than a terminal portion of the first output terminal in a sealing portion of the first output terminal, and a distance between a terminal portion of the first output terminal and a terminal portion of the second output terminal is greater than a distance between an island of the second output terminal and an island of the first output terminal.

11. The switching device according to claim 10, wherein the first output electrode is connected to the island of the first output terminal by a first bonding wire, the gate electrode is connected to a sealing portion of the gate terminal by a second bonding wire, and a sealing portion of the third output terminal is connected to an island of the first output terminal by a third bonding wire.

12. The switching device according to claim 1, wherein the switching element is a SiC trench MOSFET.

* * * * *